United States Patent [19]
Pike, Jr. et al.

[11] Patent Number: 5,283,202
[45] Date of Patent: Feb. 1, 1994

[54] IGBT DEVICE WITH PLATINUM LIFETIME CONTROL HAVING GRADIENT OR PROFILE TAILORED PLATINUM DIFFUSION REGIONS

[75] Inventors: Douglas A. Pike, Jr.; Dah W. Tsang; James M. Katana; Dumiton Scrulla, all of Bend, Oreg.

[73] Assignee: Advanced Power Technology, Inc., Bend, Oreg.

[21] Appl. No.: 945,817

[22] Filed: Sep. 15, 1992

Related U.S. Application Data

[60] Continuation-in-part of Ser. No. 852,932, Mar. 13, 1992, which is a continuation of Ser. No. 751,441, Aug. 28, 1991, abandoned, which is a continuation-in-part of Ser. No. 737,560, Jul. 26, 1991, Pat. No. 5,182,234, which is a continuation of Ser. No. 467,636, Jan. 19, 1990, abandoned and a continuation of Ser. No. 439,101, Nov. 16, 1989, Pat. No. 5,045,903 and a division of Ser. No. 194,874, May 17, 1988, Pat. No. 4,895,810 and a continuation-in-part of Ser. No. 842,771, Mar. 21, 1986, Pat. No. 4,748,103.

[51] Int. Cl.⁵ .............. H01L 21/00; H01L 21/02; H01L 21/265; H01L 21/467
[52] U.S. Cl. .......................... 437/31; 437/40; 437/41; 437/247
[58] Field of Search .............. 437/29, 31, 40, 41, 437/247; 257/213, 288, 365, 368, 378

[56] References Cited

U.S. PATENT DOCUMENTS

| | | | |
|---|---|---|---|
| 3,953,243 | 1/1976 | Goetzberger et al. | 437/247 |
| 4,497,107 | 2/1985 | Cogan | 437/41 |
| 4,778,774 | 10/1988 | Blossfeld | 437/31 |
| 4,980,302 | 12/1990 | Shimizu | 437/31 |

OTHER PUBLICATIONS

Baliga, Power Junction Gate Field Controlled Devices, IEDM, 1979, pp. 76-78.

Laska, A 2000 V-Non-Punch-Through-IGBT with Dynamical Properties like a 1000 V-IGBT, IEDM, 1990, pp. 32.6.1-32.6.4.

Tsunoda, Improved 600- and 1200-V IGBT with Low Turn-Off Loss and High Ruggedness, IEEE Power Electronics Specialist Conf., 1990, pp. 9-16.

Primary Examiner—Tom Thomas
Assistant Examiner—B. Everhart
Attorney, Agent, or Firm—Marger, Johnson, McCollom & Stolowitz

[57] ABSTRACT

For IGBT, MCT or like devices, the substrate is formed with P+, N+ and N− layers and PN diffusions to define body and source regions in the N-layer and a MOS-gated channel at the upper surface. The N-layer is sized and doped ($\sim 10^{14}$/cm³) to block reverse bias voltage. The N+ layer is >20 μm thick and doped below $\sim 10^{17}$/cm³ but above the N− doping to enhance output impedance and reduce gain at high $V_{ce}$ conditions. Or the N+ layer is formed with a thin ($\sim 5$ μm) highly doped ($> 10^{17}$/cm³) layer and a thick ($> 20$ μm) layer of $\sim 10^{16}$/cm³ doping. A platinum dose of $10^{13}$ to $10^{16}$/cm² is ion implanted and diffused into the silicon to effect lifetime control. Gate and source contacts and body and source diffusions have an inter-digitated finger pattern with complementary tapers to minimize current crowding and wide gate buses to minimize signal delay. P+ doping beneath and marginally surrounding the gate pads and main gate bus negates breakdown conditions in widely spaced body regions and convex localities at the source finger end. Wide secondary gate buses parallel to the gate fingers have a P+ doped central stripe and transverse shorting bars spaced along their length. A non-polarizable PECVD passivation film of low phosphorus PSG and nitride or oxynitride or of oxynitride alone is made by controlling ionized gas residence time, silane partial pressure, and oxygen ratio during deposition, to minimize incorporation of Si—H into the film.

8 Claims, 14 Drawing Sheets

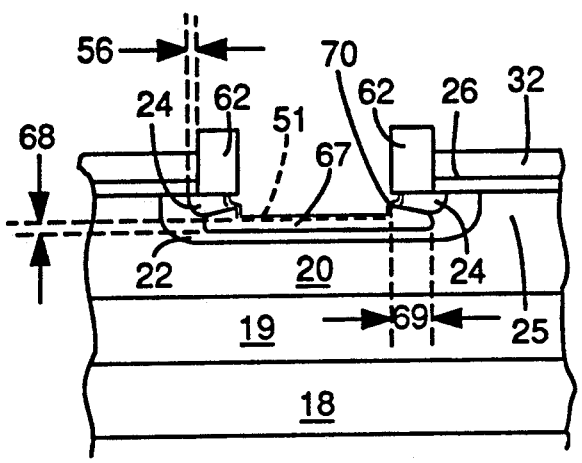
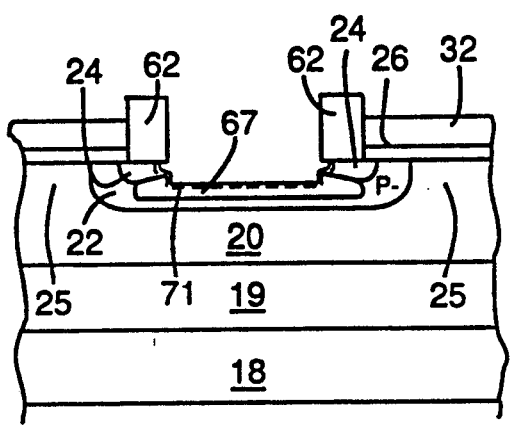
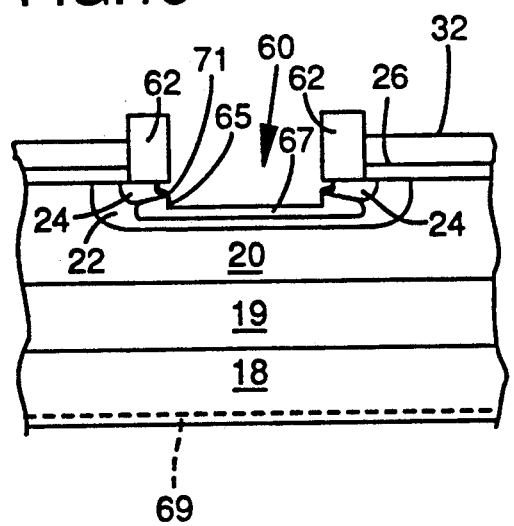
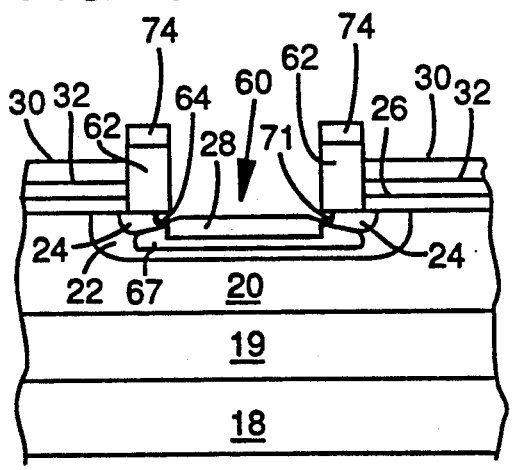

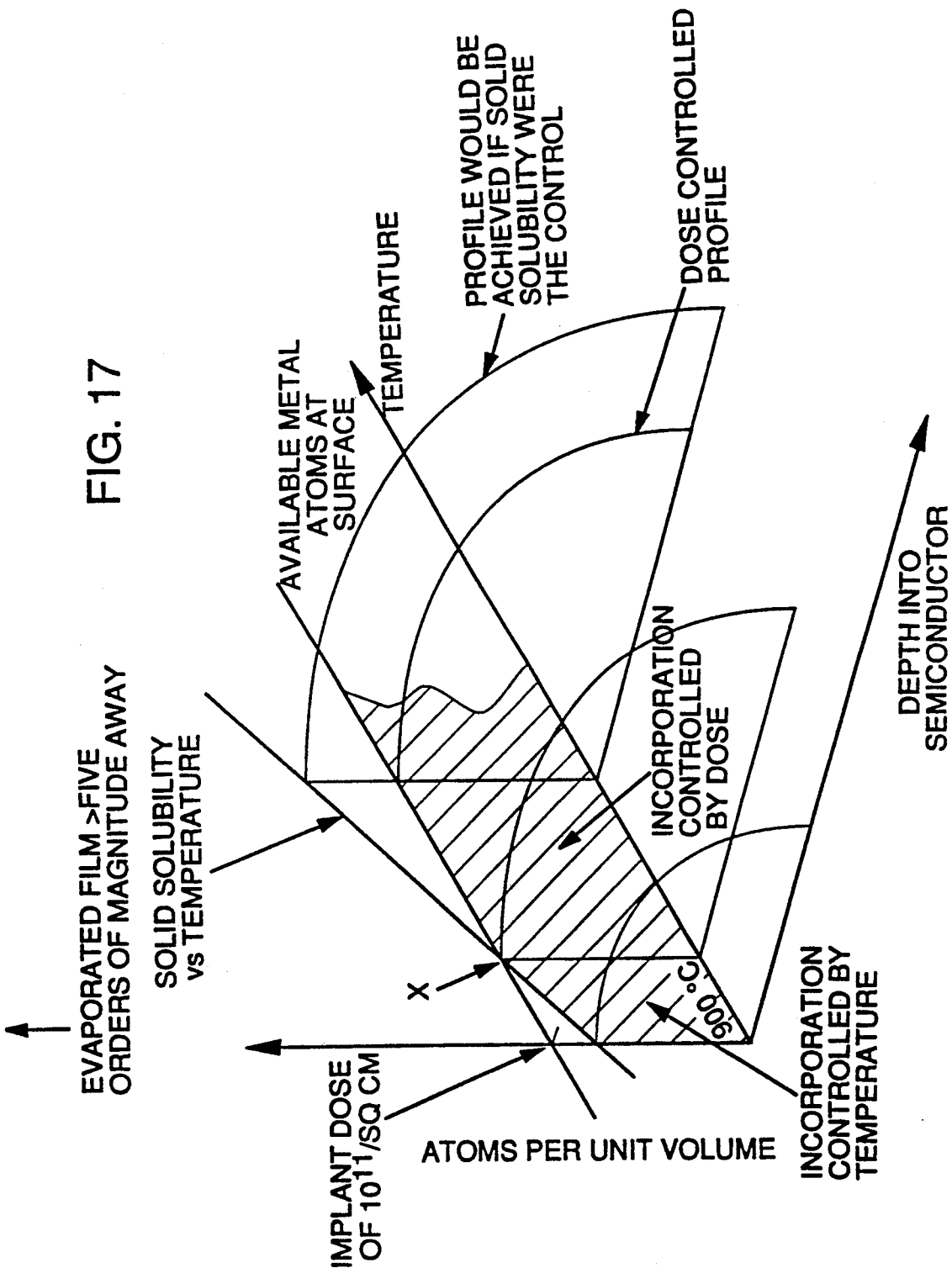

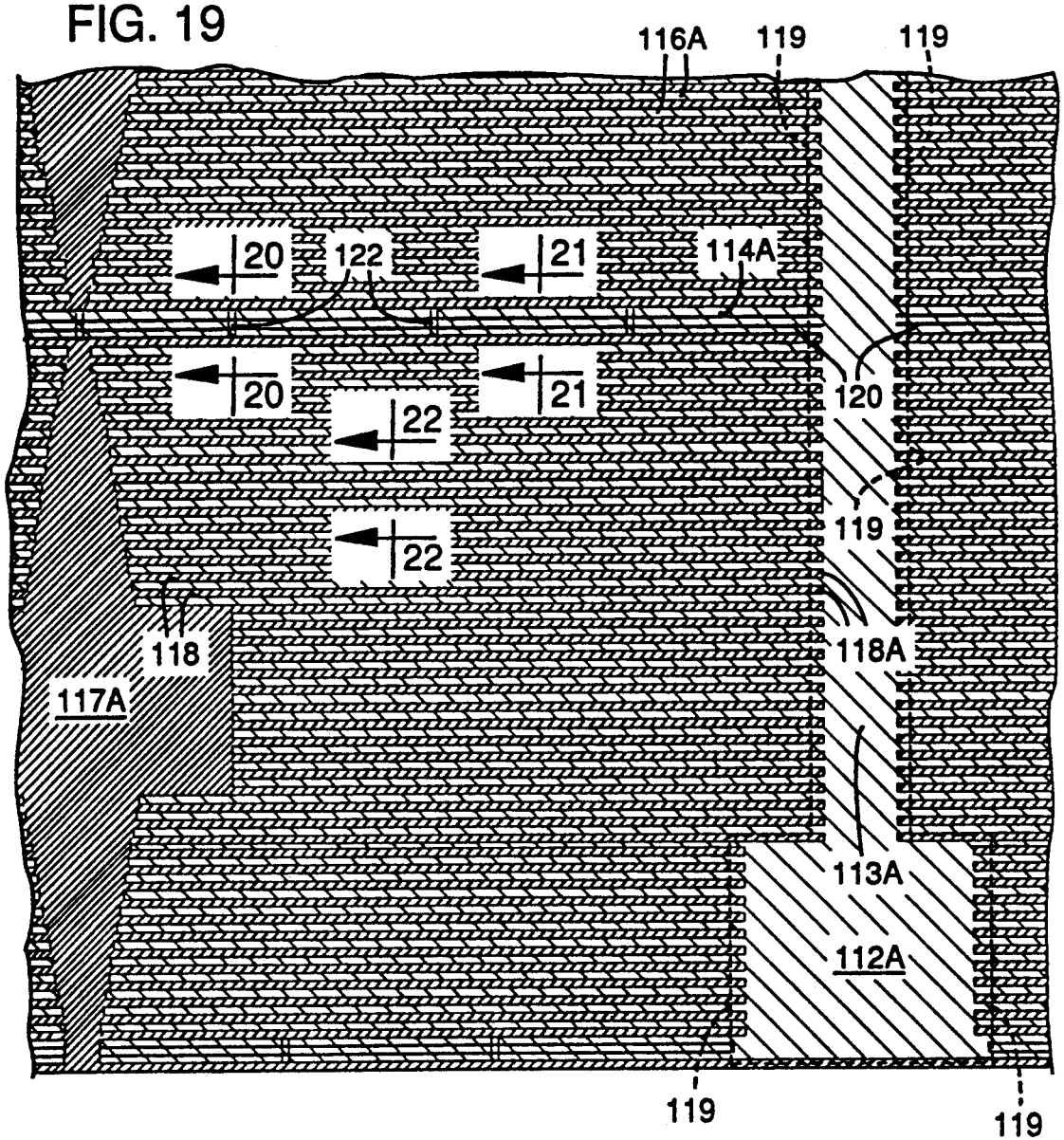
FIG. 19
 BODY & SOURCE   GATE POLY

IGBT DEVICE WITH PLATINUM LIFETIME CONTROL HAVING GRADIENT OR PROFILE TAILORED PLATINUM DIFFUSION REGIONS

RELATED APPLICATION DATA

This is a continuation-in-part of co-pending U.S. Ser. No. 07/852,932,filed Mar. 13, 1992, now U.S. Pat. No. 5,262,336, which is a file wrapper continuation of U.S. application Ser. No. 07/751,441, filed Aug. 28, 1991, now abandoned, which is a continuation-in-part of U.S. application Ser. No. 07/737,560, filed Jul. 26, 1991, now U.S. Pat. No. 5,182,234, which is a file wrapper continuation of U.S. application Ser. No. 07/467,636, filed Jan. 19, 1990, now abandoned, and U.S. application Ser. No. 07/439,101, filed Nov. 16, 1989, now U.S. Pat. No. 5,045,903, issued Sep. 3, 1991, which are divisions of U.S. application Ser. No. 07/194,874, filed May 17, 1988, now U.S. Pat. No. 4,895,810, issued Jan. 23, 1990, as a continuation-in-part of commonly-assigned U.S. patent application of T. G. Hollinger, U.S. application Ser. No. 06/842,771, filed Mar. 21, 1986, entitled MASK SURROGATE SEMICONDUCTOR PROCESS EMPLOYING DOPANT-OPAQUE REGION, now U.S. Pat. No. 4,748,103, issued May 31, 1988.

BACKGROUND OF THE INVENTION

This invention relates to a method for producing power semiconductor devices, and more particularly to insulated gate power device fabrication process and structure. More specifically, this application is directed to improvements in a single-mask process based on that disclosed in applicant's U.S. Pat. No. 4,895,810 to make four-layer(PNPN) devices, such as insulated gate transistors (IGT or IGBT), MOS controlled thyristors (MCT), emitter controlled thyristors and other gate controlled minority carrier devices, as well as power MOSFET devices.

U.S. Pat. No. 4,895,810 discloses a MOSFET fabrication process and structure which, among other advantages, substantially eliminates the incidence of fatal defects in a power device as a consequence of defects in, and/or misalignment between, the layers used in the production of such devices. This process uses a single mask to form all of the active device areas of a MOSFET structure, with recessed source regions self-aligned to an MOS gate structure and sized by sidewall spacers and an enhanced-conductivity body region underlying and self-aligned to the source regions.

Based on teachings available in the prior art, it was believed that the previously-disclosed MOSFET fabrication process and structure could be readily adapted to the fabrication of insulated gate bipolar transistors and other gate-controlled four-layer devices. That proved to be much more difficult than was thought.

The development of insulated gate bipolar transistors and other gate-controlled four-layer (PNPN) devices can be traced through the following references:

Atalla U.S. Pat. No. 3,206,670
New U.S. Pat. No. 3,210,563
Gentry, U.S. Pat. No. 3,324,359
Plummer, U.S. Pat. No. 4,199774
Becke et al, U.S. Pat. No. 4,364,075
Temple, U.S. Pat. No. 4,417,385
Baliga U.S. Pat. No. 4,443,931

Ohmi, Power Static Induction Transistor Technology, IEDM pp. 84-87 (See FIG. 7), 1979

Baliga, Power Junction Gate Field Controlled Devices, IEDM pp. 76-78, 1979

Plummer et al, Insulated Gate Planar Thyristors:
 I—Structure and Basic Operation
 II—Quantitative Modeling
IEEE Trans. Electron Devices, ED-27 pp. 380-394, 1980

Leipold et al, A FET-Controlled Thyristor in SIPMOS Technology, IEDM pp.79-82, 1980

Tihanyi, Functional Integration of Power MOS and Bipolar Devices, IEEE pp.75-78, 1980

Baliga et al, The Insulated Gate Rectifier (IGR):
 A New Power Switching Device, IEDM pp. 264-267, 1982

Russell et al., The Comfet-A New High Conductance MO Gated Device, IEEE Electron Device Lett., EDL-4, pp. 63, 1983

Wheatley et al, COMFET - The Ultimate Power Device; A General Study of Power Devices, Solid State Technology pp. 121-128, Nov. 1985

Kuo et al., Modeling The Turn-off Characteristics of the Bipolar-MOS Transistor, IEEE Electron Device Lett., EDL-6, pp. 211-214, 1985

Kuo and Hu, Optimization of Epitaxial Layers for Power Bipolar-MOS Transistor, IEEE Electron Device Lett., EDL-7, p. 510-512, 1986

Lorenz, Selection Criteria for Power Semiconductor for Motor Drives, Proceedings of 1990 International Symposium on Power Semiconductor Devices and ICs, Tokyo, pp. 263-269, 1990

Tsunoda et al., Improved 600- and 1200 V-IGBT with Low Turn-off Loss and High Ruggedness, Proceedings of the Power Electronics Specialists Conference, San Antonio, Tex., pp. 9-16, June 1990

Baliga, MODERN POWER DEVICES, Ch. 7 and 8, 1987

With knowledge of this art, applicant tried to make insulated gate bipolar transistors based on applicant's prior work and experience and could not fabricate commercially operative devices. Such devices exhibited latchup under virtually all operating conditions, even when using a buffered N+ layer as taught by Becke et al. and analyzed by A. Nakagawa et al of Toshiba in "Non-Latchup 1200 V 75A Bipolar-Mode MOSFET with Large ASO" IEDM, pp. 860-861, 1984, and "Experimental and Numerical Study of Non-Latch-up Bipolar Mode MOSFET Characteristics" IEDM, pp.150-153, 1985.

Not only was latchup obtained under different conditions in applicant's experimental devices, latchup occurred in different cells and regions of the devices. Problems were particularly acute when trying to switch an inductive load. Current turnoff time also proved to be very slow $> 1 \mu S$. At the same time, it remains important to maintain both a low forward voltage drop or on-resistance, and to have sufficient reverse blocking capability. Also, such devices require an adequate ability to withstand high voltage($V_{ce}$) short circuit conditions.

The performance requirements for IBGTs today has advanced substantially from where they were in the mid 1980's. More parameters are being evaluated for device selection such as discussed by Lorenz. The early analyses by Kuo and Nakagawa were optimizing for forward voltage drop and switching speed without considerations for ruggedness such as short circuit withstand capability and safe operating area (SOA). Given the more stringent requirements of the 1990's, the recommendations of these early works are no longer completely valid. For example, the optimal epi design—suggested by Kuo and Hu of >5 μm thick N+ layer at $10^{18}/cm^3$ doping level operating with N− layer completely depleted would be a terribly weak device on short circuit withstand capability even though the forward voltage may be good.

A. Nakagawa et al (IEDM 85) describe the need for PNP common base current gain $\alpha > 0.27$ to maintain sufficient conductivity modulation hence a low forward voltage drop using an N+buffer layer under an N− drift region. No consideration was given to designing for ruggedness by epitaxial material selection. Device ruggedness is directly impacted by the high voltage/high current gain. We have discovered that this characteristic is affected by the N+ thickness and doping concentration. A. Nakagawa et al do not describe these aspects of their device although they and others have used about $3 \times 10^{16} - 10^{18}/cm^3$ doping concentrations in their analyses and discussions and less than about 20 micrometers thickness for the N+ buffer layer. Tsunoda et al. reported experiments with adjusting the N− layer thickness and the N+ doping profile, but nothing in regard to N+ layer thickness. The paper did not give any values on layer thicknesses or doping concentrations for the devices measured and analyzed.

Siemens has, conversely, proposed elimination of the N+ layer altogether and, instead, making the N− layer very thick, e.g., 200-350 micrometers, without minority carrier lifetime control, as described by T. Laska in "A 2000 V-Non-Punch-Through-IGBT with Dynamical Properties like a 1000 V-IGBT" IEDM, pp. 807-810, 1990. The main drawback of this long-base approach is very high forward voltage or conduction loss (high on-resistance). Petterteig and Rogne compared switching losses of various vendor's samples of IGBT-type devices including applicant's initial experimental devices, in EPE FIRENZE, 1991, and showed that, in hard turnoff condition, the long-base Siemens device does not completely switch off after a few microseconds compared to less than about one microsecond for the other devices.

Other latching countermeasures are known to have been tried in the prior art but with varied success and questionable applicability to the particular process, using a single mask and recessed source contact areas, employed by applicant to fabricate devices. Goodman et al. U.S. Pat. No. 4,587,713 uses a deeply implanted laterally-extending supplemental P+ doped region in the P-type base to reduce bipolar transistor gain. Blanchard U.S. Pat. No. 4,345,265 employs a distributed diode with lower breakdown voltage than the DMOS transistor to non-destructively absorb transients and a shunt conductance for the channel region to reduce both voltage and voltage gradient in the base. Yilmaz U.S. Pat. No. 4,809,045 provides paths for reverse current flow spaced from the emitter-base junction and enlarges the ratios of the base region and the emitter region surface areas in contact with the emitter electrode within a contact window. Nakagawa et al disclose, in UK Pat. Application No. 2,161,649A, various methods for avoiding latchup by keeping the saturation current of the device smaller than the latch-up current, including proportioning of active device areas and providing a hole-current path from the drain to the source.

Prior workers have also tried different ways to control minority carrier lifetimes within the device. Baliga, MODERN POWER DEVICES, pp. 36-58, 380-387 and 410-413, describes how the switching speed of the IGT, P-i-N rectifiers and other devices can be increased by the introduction of recombination centers in the N-base region to reduce minority carrier lifetime. In general, two approaches have been used, either diffusion of transition elements impurities such as gold or platinum into the silicon or by high energy particle bombardment, e.g., by neutron, proton, electron or gamma irradiation, to create lattice damage in the silicon. Among these approaches, Baliga teaches that electron irradiation is preferred, offering among various advantages tighter distribution in device characteristics. Using lifetime control involves tradeoffs in device operation, as discussed in Temple et al., "Optimizing Carrier Lifetime Profile for Improved Tradeoff Between Turn-Off Time and Forward Drop," IEEE Transactions on Electron Devices, Vol. ED-30, No. 7, pp 782-790, July 1983.

Conventionally, diffusion of transition elements impurities is performed for lifetime control purposes by [1]deposition of a 100Å to 1000Å thick layer of the selected element onto a surface of the silicon wafer and diffusing atoms of the element from the layer into the silicon at a temperature in the range of 800°-900° C. The diffusion temperature determines the solid solubility of the impurity atoms in silicon and can be used to control the impurity density. Metal implantation has also been used for other purposes. For example, high dose implants have been used to create ohmic contacts in integrated circuits. Low dose implantation (up to $2 \times 10^{13}/cm^2$) has been used to adjust Schottky barrier height in discrete devices and integrated circuits. In these procedures, the dose is retained near the surface.

The particle bombardment approach uses either electron, proton, neutron or gamma irradiation. It is typically performed at room temperature, and then the devices are subjected to a low-temperature annealing procedure, although Baliga states that high temperature (300° C.) electron radiation has been used.

Several drawbacks exist, however, in these approaches to lifetime control. Both approaches, as practiced in the prior art, can substantially increase leakage current. The particle bombardment approach also causes threshold instability. Low temperature annealing is typically required to restore the desired threshold voltage by partially annihilating trapped charge in the gate oxide and at the gate oxide-silicon interface. Once the devices have been irradiated and annealed, however, they cannot be subjected to higher temperatures in further fabrication procedures, such as during die attachment. The devices are also subject to long-term instability during use in high temperature applications. Radiation defects anneal out between 300° C. and 400° C. This is a temperature range necessary to achieve good wetting of silicon to package during die attachment.

Evaporation and diffusion of transition metal impurities into silicon is not subject to such instability effects but, as conventionally practiced, is difficult to control. It also creates the largest increase in leakage current compared to similarly processed devices without lifetime control. For example, conventional diffusion of platinum from a layer evaporatively deposited onto the silicon surface yields an increased leakage current that is one to two orders of magnitude higher than the leakage current produced by irradiation and particle bombardment, and three orders of magnitude higher than no lifetime control. Alternatively, a technique for spinning on a layer of platinum (e.g., Emulsitone platinum film) is commonly used (See Lisiak et al, J. Appl. Phys. Vol. 46, No. 12, pg. 5229, Dec. 1975). This procedure also provides poor dosage control. Thus, a better lifetime control method is needed.

It has been previously observed and is the subject of applicant's co-pending U.S. patent application Ser. No. 07/663,297, SEMICONDUCTOR DEVICE WITH DOPED ELECTRICAL BREAKDOWN CONTROL REGION (continuation of Ser. No. 06/842,464, filed Mar. 21, 1986), that there are regions on a device layout that are prone to lower breakdown voltage than otherwise achievable from the active cells which tend to be of similar repetitive dimensions. These breakdown-prone regions are typically created out of necessity, for example, to provide gate bonding pads and low signal-delay buses. In order to retain the performance capability inherent in the cells while permitting proper interfacing and signal propagation on a chip, application Ser. No. 07/663,297 disclosed doping under these structures with the same dopant type as the body diffusion with well-matched junction depth to smooth out the transition from the body to diffusion under the gate so as to form a single contiguous region of smooth curvature. The base resistance of the parasitic bipolar transistor is reduced much below that of the active cells due to the pad/routing bus doping into the body regions. The net effect is the total elimination of premature breakdown and failure during inductive switching at gate pads/gate routing buses below the designed capability of the active cells. The active MOS channels around the periphery of the odd gate structures are also rendered completely inactive by so doing. Thus, a better way is needed to suppress breakdown under gate bus areas in large current MOSFET and IGBT-type devices without substantially reducing useful channel.

After a semiconductor device is processed and metallized, a passivation or scratch protection layer is typically deposited on the top surface. Only the bonding pads are opened to make electrical connections outside the chip after this step. This passivation layer must be a moisture and mobile ion barrier against the harsh environment that is hazardous to MOS devices in the packaging and assembly area. This goal is met in low voltage devices by using a silicon nitride-based film or a PSG (phosposilicate glass) film (<4%). The most popular methods in use today for film deposition are PECVD (Plasma Enhanced Chemical Vapor Deposition) and LTO (Low Temperature Oxide)deposition. PECVD can be used to deposit both nitride and oxide while the latter method (LTO) is used only for oxide. Both methods work very well for passivating low voltage semiconductor devices. When these same quality films are conventionally deposited on top of high voltage devices, however, undesirable polarization effect develops which is not observable at low voltage.

Polarization effect per se is known to the integrated circuits industry where it is not a serious problem but it is not at all well understood for high voltage applications. In a prior art disclosure (U.S. Pat. No. 4,399,449, column 8, lines 19-2), the inventors clearly specify the removal of a polarizable film of heavily doped silox (phosphorus content must exceed 6%, typically 8% is used, to have substantial reflow of the deposited silicon oxide film) in the guard ring area of a high voltage device. No details are disclosed as to the limits of the film property or the mechanism of the problem. The literature has been fairly silent on similar effects on lower doping PSG and silicon nitride films even though the problem of polarization has been recognized on other types of films such as borosilicate glass (Murakami et al., "Polarization Induced Instability in a Glass Passivated p-n Junction" J. Electrochem. Soc., Vol. 133, No. 7, pp. 1467–1471, July 1986. Stress, composition, and wet etching characteristics have been reported previously such as by Claassen et. al. (Characterization of Silicon-Oxynitride Films Deposited by Plasma-Enhanced CVD, ibid, pp. 1458–1463) for oxynitride films deposited with varying gas phase compositions. Barrier effectiveness of oxynitride has also been the subject of studies such as by Hashimoto et al. (Properties of PEVD SiOxNy Films as Selective Diffusion Barrier, ibid, pp. 1464–1467) for Zn. However, no information on polarizability has been disclosed on these films. Thus, further development of passivation films is needed for high voltage power switching devices.

Accordingly, a need remains for an IGBT-type power device structure and fabrication process that can produce high voltage solid-state power switches capable of conducting and switching high currents and voltages at high speed but without undesirable parasitic effects.

SUMMARY OF THE INVENTION

A general object of the present invention, therefore, is to provide an improved process for making four-layer(PNPN) devices, such as insulated gate transistors (IGT or IGBT), MOS controlled thyristors (MCT), emitter controlled thyristors and other gate controlled minority carrier devices, as well as power MOSFET devices, on a silicon substrate.

Another object is to improve the operating characteristics of solid-state MOS-gated power switching devices, including forward conduction, reverse bias blocking, turnoff time, and control of susceptibility of latching and other breakdown conditions.

A further object is to control minority carrier lifetime in silicon power switching devices, including IGBT and MCTs, without appreciably increasing leakage currents and without threshold instability.

Another object is to facilitate control of localized latchup conditions in power MOSFET/IGBT/MCT devices.

Yet another object is to enable the devices to withstand high voltage($V_{ce}$) short circuit conditions for over ten microseconds.

A further object of the invention as aforementioned is to enable control of the forward gain of the PNP portion of the device and, in particular, to obtain both low gain and high output impedance and to minimize long current tail during turn-off with minimal sacrifice of forward voltage.

An additional object is to reduce stress polarization of passivation layers in power switching devices and, more particularly, to provide the power device surface with a nonpolarizable dielectric film which is also an excellent mobile ion barrier.

The invention is an improved three-layer power MOSFET or four-layer IGBT/MCT fabrication process and structure. The invention is preferably, but not essentially, implemented in a process which uses a single, independent mask to produce the usual plural, functional regions of a three-layer or four-layer MOS gate-controlled power switching device. The device is made on a substrate which has upper and lower surfaces and which includes, depending on the type of device, one or more doped silicon layers, at least one of which forms a vertical drain region. A dopant-opaque region or layer, such as polysilicon on gate oxide on the upper substrate surface, serves as a pattern definer during fabrication of the device. The pattern definer provides control over both the doping steps used to create the necessary operative junctions within a silicon substrate and the conductive structures formed atop the substrate.

This control can be enhanced by spacing the source and gate conductive layers vertically apart at a boundary defined by the pattern definer. This can done by forming a trench into which a recessed source conductive layer is deposited in electrical contact with oppositely-doped body (npn bipolar base) and source (npn bipolar emitter) regions of the substrate at the same time that a gate conductive layer is deposited atop a gate structure which preferably comprises the oxide layer and a conductively-doped lower portion of the polysilicon layer forming the pattern definer. The trench is formed in an exposed portion of the upper surface of the substrate bounded by the pattern definer and is preferably profile-tailored to produce an overhang of the gate oxide which further enhances separation of the source and gate conductive layers. Separation of gate and source conductive layers can be further assured by forming a sidewall spacer on the sides of the polysilicon and gate oxide layers, depositing conductive material, applying a planarizing layer and selectively removing any conductive material deposited atop the spacer. The polysilicon layer is reduced in thickness so that the spacers, and any conductive material deposited atop them, protrude upward for easy removal of excess, conductive material. This reduction can be done advantageously in combination with the aforementioned trenching procedure.

Electrical contact between the source conductive layer and the source (npn emitter) regions, spaced apart by the spacers and recessed trench sidewalls, can be enhanced by forming a low-resistivity layer between them. This can be done either by dopant diffusion, selective deposition of metal or silicide formation in the exposed silicon in the trench.

The transistor body (npn base) and source (npn emitter) regions are preferably formed by doping the exposed upper silicon surface to different depths with opposite dopant-type diffusions prior to forming the trench. The depth of the trench is gauged to separate the shallower, second doped region into two source (npn emitter) regions located along opposite sidewalls of the trench. This sequence has two advantages. First, the location and spacings of the PN junctions are subject only to two variables, that is the diffusions themselves, and not to a third variable of the trenching procedure. This enables tight control of $V_{th}$. Second, most defects introduced in the semiconductor surface material due to ion implantation or gaseous diffusion of the dopants are removed by subsequent trenching, thus reducing leakage current, due to downward propagation of the defects in a subsequent diffusion. A third region of the same dopant type as the first, body diffusion is co-diffused into the substrate after forming the trench to limit the downward extent of diffusion of the source regions and increase parasitic bipolar base conductivity below the source metallization and the source regions. This improves reverse-bias avalanche and inductive turnoff ruggedness characteristics of the device.

The sidewall spacers are sized, either alone or in combination with profile tailoring of the trench, to control source-region width (i.e., parasitic pinched P-base width) and proximity of the source conductor to the FET channel. This affects the npn base resistance under the length of the source (npn emitter), which helps control latching.

In fabrication of the devices to overcome the drawbacks of the prior art, one aspect of the invention is to size and dope the N+ buffer region so that the output impedance of the device is raised sufficiently to pass short circuit withstand test requirements, typically >10 microseconds at 80% of rated anode-to-cathode voltage. The short circuit withstand current should not exceed 3× the room-temperature-rated (25° C.) continuous anode-to-cathode current (commercially-available devices all exceed 4×) and is preferably between 2× and 2.5×. This is preferably done in combination with an N− drift region having a doping and thickness just sufficient to block the maximum reverse bias voltages for which the device is designed. The prior art has an effective output impedance in the range of 0.5 to 2 ohms for a device having approximately 120 cm. of channel width and a rated voltage of 600 volts. It is desired to at least double this impedance to reduce forward conduction current by a minimum factor of two. For a similar device, output impedance should be at least 3 ohms so that short circuit withstand current at the end of a short circuit pulse does not exceed 3× the room-temperature-rated continuous anode-to-cathode current at 80% of $V_{ce}$. It would be preferable to have an output impedance in such a 120 cm. channel width 600 volt device in the range of 3 to 5 ohms to resist the current flow during forward conduction at high $V_{ce}$. Similar current requirements hold for higher voltage devices. For devices of different channel widths, output impedance will be inversely proportionate to channel width, so effective output impedance can be conveniently expressed in ohm-cm. The effective output impedance should be in a range of 370 to 560 ohm-cm. at $V_{ce}=480$ V for a 600 V-rated device. For a 1000 V-rated device, the range of 6 to 9 ohms provides 2× to 3× the room-temperature-rated current at $V_{ce}=800$ V.

Devices in accordance with this aspect of the invention have an N+ doping of less than $10^{17}/cm^3$ but greater than the doping of the N− region, and a thickness of greater than 20 micrometers. Such devices are suitably made with an N+ doping preferably in the range of $5\times10^{15}/cm^3$ to $9\times10^{16}/cm^3$, and a thickness preferably in the range of 20–40 micrometers. It is believed that the best devices will be produced with an N+ doping of about $5-9.0\times10^{16}/cm^3$ and a thickness of about 30 micrometers, plus or minus 20%. A suitable N-drift region doping is about $10^{14}/cm^3$ and a thickness sufficient to block a reverse bias voltage of 1000 volts is about 80 micrometers; lesser thicknesses are sufficient for lesser voltages.

In another aspect of the invention, a minority carrier lifetime control procedure is performed using a transition metal, preferably platinum (Pt) but alternatively gold (Au) or another metal having a deep level in silicon suitable for recombination. Essentially, this method of lifetime control includes implanting a limited dose of the selected transition metal into the substrate and then diffusing the metal atoms throughout the substrate. Using a transition metal rather than irradiation avoids threshold instability problems and can be done, contrary to conventional teachings, in such a way that leakage current is not appreciably increased and minority carrier lifetime is very tightly controlled.

In accordance with this aspect of the invention, the substrate is doped with a transition metal in a predetermined dose less than a predetermined maximum, which is about $2 \times 10^{16}$ atom/cm$^2$ for platinum. Preferably, this is done by ion implantation of transition metal into the silicon substrate. A suitable alternative with Pt or other transition metals having a stable silicide is evaporative or sputter deposition with in situ silicide formation followed by stripping away the excess metal to leave a thinner layer of silicide, less than about 20 Angstroms for platinum silicide (about $10^{16}$ atoms/cm$^2$). Then, the substrate is annealed to diffuse the metal at a predetermined temperature above the eutectic temperature of the transition metal/silicon binary system, which for platinum in silicon is 830° C.

Also, in another aspect of the invention, fabrication of the devices includes measures to minimize localized breakdown conditions or regenerative action which can cause latchup in four-layer devices. The preferred layout of the devices, in an interdigitated finger structure, is improved in two ways. First, the source and gate finger structures are tapered in a complementary fashion such that the width of the source metal fingers increases from their distal ends proceeding toward their proximal ends at which the source metal fingers are connected to a common source bus. The interdigitated gate metal fingers have a width that is likewise least at their distal ends and increases proceeding toward their proximal ends connected to a common gate bus (i.e., toward the distal ends of the source metal fingers). These shapes serve to increase the current-carrying capacity of the source metal fingers approaching the common bus to minimize current crowding problems. Second, the area under the gate buses is doped with a dopant type like that of the MOSFET body (P-type in N-channel devices) in a fishbone-like pattern defined by a longitudinal central stripe spaced between the channels along opposite sides of the gate bus and shorting bars across the central stripe spaced at intervals to couple the stripe to the body regions while retaining a substantial proportion of active channel between the bars. The ends of source fingers constituting high field points are protected, according to the procedure of U.S. patent application Ser. No. 07/663,297, by P-doping margins along the main gate bus gate to neutralize the active channel areas at the ends of source fingers.

Finally, a nonpolarizable dielectric film is deposited to passivate the surface of the substrate. The film includes, in one embodiment, a conformal first layer of phosphosilicate glass (PSG) with a phosphorus content of less than 4% and preferably 3.5% or less and a second layer that is a moisture and mobile ion resistant barrier, such as silicon nitride or oxynitride. The first layer is deposited in such a way as to be nonpolarizable even under very high voltage conditions, e.g., 800–1200 volts. The first layer can be made thick, e.g., 10,000–35,000Å, and the second layer very thin. In this way, the second layer can be of a polarizable material but is spaced from the silicon surface, by the first layer to reduce net charge creation due to polarization while retaining mobile ion and moisture resistance. Or, the first layer can be made thinner and the second layer also made in such a way that it is nonpolarizable. Alternatively, in a second presently preferred embodiment, a single layer of oxynitride is deposited in such a way as to form a nonpolarizable film. Oxynitride is a suitable mobile ion and moisture barrier by itself and can be made nonpolarizable by using the deposition technique summarized below. This film, too, is relatively thick, in order to provide adequate step coverage when used in combination with the preferred recessed source metal structure of applicant's high voltage devices. The nonpolarizable dielectric film can be thinner in more planarly surfaced devices.

The technique used for deposition of nonpolarizable oxynitride and low phosphorus PSG films is to minimize the incorporation of ionized gases, specifically, ions of hydrogen compounds, during PEVCD. This is done by limiting the residence time of ionized gases during deposition.

The foregoing and additional objects, features, and advantages of the present invention will be more readily apparent from the following detailed description of a preferred embodiment which proceeds with reference to the accompanying drawings.

BRIEF DESCRIPTION OF THE DRAWINGS

FIGS. 3–13D and 14–16D, inclusive, are enlarged, fragmentary views, taken generally in the area bracketed by the letters A—A in FIG. 2, illustrating successive steps according to one manner of practicing the invention.

FIG. 17 is a three-dimensional diagram of diffusion of a transition metal (Pt) into silicon in accordance with the invention.

FIGS. 18 and 19 are successively enlarged plan views of a die incorporating a transistor structure made in accordance with the method of FIGS. 3–13D and 14–16D, showing an improved interdigitated finger layout.

DETAILED DESCRIPTION OF THE INVENTION

Figure 1:
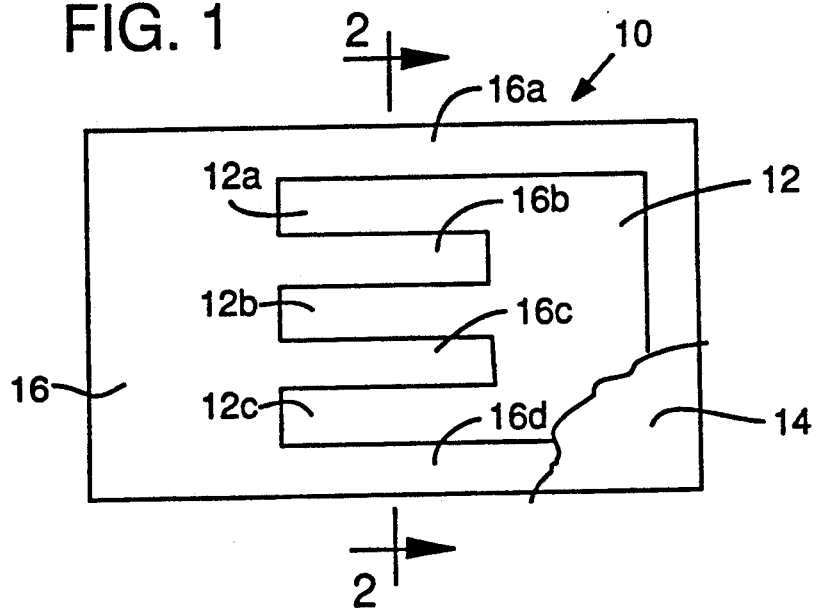
FIG. 1 is a simplified plan view, with a portion broken away, of a power MOSFET insulated gate transistor manufactured in accordance with the steps of the present invention.
Figure 2:
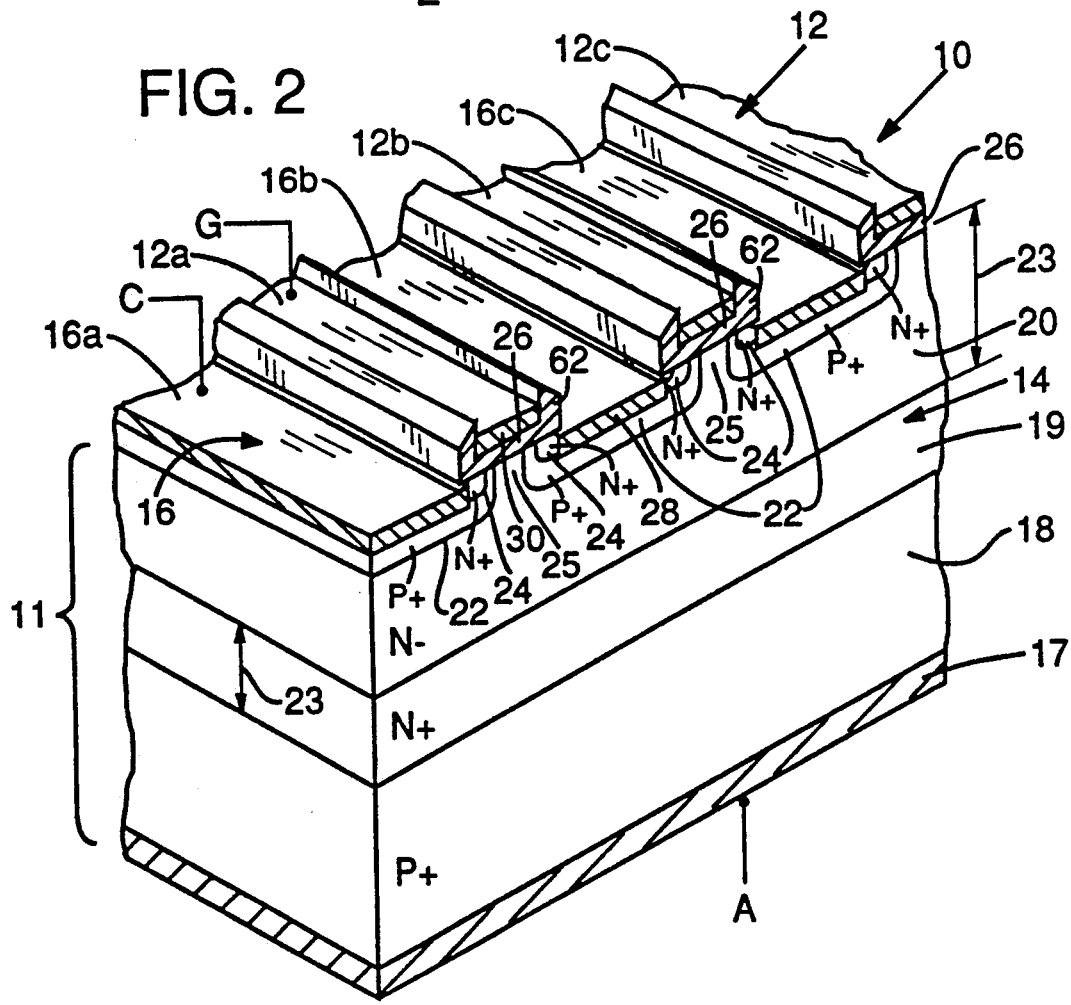
FIG. 2 is an enlarged, fragmentary, perspective view illustrating a section of the device of FIG. 1 taken generally along the line 2—2 in FIG. 1.

Turning to FIGS. 1 and 2, indicated generally at 10 is an insulated gate bipolar transistor (IGBT) device incorporating an N-channel, power-MOS field-effect transistor which has been manufactured on a silicon substrate 11 according to the present invention. In the description which now immediately follows, examples of dimensions are given. These dimensions are specific to a transistor designed to act as a 500-volt switch but may be varied to handle different voltages.

Transistor 10 is like prior art devices in that it includes a gate 12, a drain 14 and a source structure 16 collectively forming the MOSFET portion of the device 10. In the particular transistor embodiment shown in these two figures, gate 12 includes three "fingers" 12a, 12b, 12c, arranged in an open topography. Similarly, the source structure includes four fingers 16a, 16b, 16c, 16d interdigitated between and surrounding the fingers of gate 12. A more detailed illustration of a preferred device layout appears in FIGS. 18 and 19.

The substrate 11 is arranged to form a four-layer NPNP structure including the MOSFET portion, and NPN and PNP bipolar transistor portions of device 10. The gate 12 and source structure 16 of the MOSFET portion are formed on an upper, or reference, surface of the substrate, and the drain 14 is formed in epitaxial layers 19, 20 deposited on the bulk of the substrate 18. The MOSFET source structure 16 forms the bipolar emitter contact or cathode of the upper or NPN bipolar portion of transistor 10. The drain 14 forms a base region of the lower or PNP bipolar portion and a metal contact 17 on the underside of the substrate forms a PNP emitter contact or anode of device 10. More specifically, substrate 11 includes a P+ doped layer 18, an N+ doped first epitaxial or buffer layer 19, and an N− doped second epitaxial layer 20. The N-type layers 19, 20 collectively form drain 14 of the MOSFET portion, the collector region of the upper NPN bipolar portion of the device and the base region of the lower PNP portion of the device, and are referred to alternatively as the N-drift region.

A P− doped region 22 underlying each of fingers 16a-16d forms the so-called "body" in the MOSFET portion and the base of the NPN bipolar transistor portion. Residing in region 22 and extending continuously along a side of each of fingers 16a-16d adjacent the gate fingers 12a-12c is an N+ doped region 24 which forms the source in the MOSFET portion and the emitter of the NPN bipolar transistor portion. A region 25 of the N-substrate region 20 extending to the substrate surface beneath the gate fingers 12a-12c provides a MOSFET drain conduction path of width L (See FIG. 22) between lateral regions 22.

Immediately above the regions 22, 24, at the upper surface of substrate 11, are a gate-oxide layer (SiO₂) 26, also referred to as a MOS outer layer, and two metallization layers 28, 30. These two metal layers are typically formed, and herein are formed, of aluminum, although other materials may also be used. Layer 28 lies within a trench in the upper surface of the substrate and acts as an electrical contact for the underlying P-type body (base) region 22 and the N-type source regions 24 extending along the sides thereof. Layer 30 forms a conductor for the previously mentioned gate 12. Region 22 preferably includes an enhanced P+ doped region beneath the source metal 28 and source regions 24, as further described below.

In operation, when device 10 is switched on, a majority-carrier (electron) current flows from the source regions 24 to drain regions 25 via an inversion layer, or N-type channel, formed in a near-surface portion of the normally P-type regions 22 subjacent the gate fingers 12a-12c as a result of an electric field induced by biasing gate 12. A minority-carrier (hole) current flows from the P+ substrate 18 through the N-drift region 19,20 to the P-type region 22. While the device is operating in an on-state, the minority carrier current should approximate or exceed the majority current to reduce forward or on-state resistance but if nonregenerative operation is desired should not be so great as to forward bias the PN junction between regions 22 and 24 sufficiently to turn on the upper, NPN transistor. When transistor 10 is switched off, the majority-carrier (electron) current flow via the channel is blocked and the minority carrier current flow in the lower PNP transistor tails off at a rate that is determined by minority carrier lifetime characteristics of the N-drift region 19, 20. Desirably, for fast turnoff of the device, this tail current is as short in duration as feasible while maintaining ruggedness and an acceptable forward on resistance.

When the device is operated in normal conditions, the forward voltage drop should be kept as low as possible to minimize conduction loss in the device.

When the device is operated with a high forced $V_{ce}$ across its collector and emitter, such as during inductive switch-off and short circuit fault conditions, the gain must be minimized to prevent regenerative actions. Furthermore, under a short circuit condition with full gate voltage applied, the output resistance $R_o$ must be high enough to prevent excessive power dissipation in the switch within a time duration usually greater than 10%s to allow detection and safe shutdown. While the device is in the off-state, the N-drift region should block the voltage across terminals 16, 17 of the device with a minimum of leakage current. The ability of the device to control high voltages should not degrade with continued operation over a long period of time. The various claimed aspects of the present invention help achieve these disparate goals.

With attention now drawn to FIGS. 3-28, inclusive, let us consider how device 10 is formed in accordance with one manner of practicing the invention to form an IGBT device.

Figure 3:
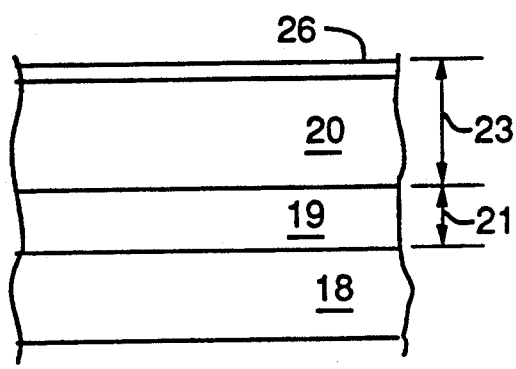

Referring to FIG. 3, layers 19, 20 of N+ and N− doping respectively are epitaxially deposited on a commercially available P+ silicon wafer. The N−layer is doped and sized to an appropriate thickness that will ensure blocking of reverse bias voltages within the design specifications of the device as known in the art. The N+ layer is doped and sized commensurate with the desired forward voltage and gain of the device, as further described below. The result is to form the substrate structure 11 for the manufacture of device 10, on which an oxide layer 26 is formed. To form an improved MOSFET device using the principles of the present invention, an N-type substrate is used as described in our prior U.S. Pat. No. 4,895,810, using the processing procedures described below. The remainder of this description is directed to an IGBT device as shown in the drawing Figures except where differences are specified for MOSFET devices.

In the particular structure now being described, the P+ layer 18 has a thickness of about 15-mils and a resistivity of about 0.007–0.02 ohm-centimeters. In general, epitaxial layer 19 can have a thickness of about 4 to 50 micrometers and a resistivity of about 0.03 to 5.0 ohm-centimeters. In extreme cases, for purposes of illustration, one can take the layer thickness to several hundred micrometers and resistivity equal to that of the N− layer 20 and arrive at Laska's condition, or take the layer thickness to <5 micrometer and resistivity to 0.02 ohm-centimeter and achieve Kuo and Hu's recommended profile. Alternatively, a triple-layer epi design could be used to combine a lighter-doped but thicker layer with Kuo and Hu's thin layer 19. Epitaxial layer 20 has a thickness that varies with device blocking-voltage requirements. For a 1000 volt device, a suitable doping in the N- drift region is about $1 \times 10^{14}$ atoms/cm$^3$ and its thickness should be 80 micrometers or more. For a 500 volt device, doping in the N− drift region can be about $3 \times 10^{14}$ atoms/cm$^3$ and its thickness 23 about 40 micrometers. In the latter example, epitaxial layer 20 has a resistivity of about 14–18 ohm-centimeters.

Figure 24:
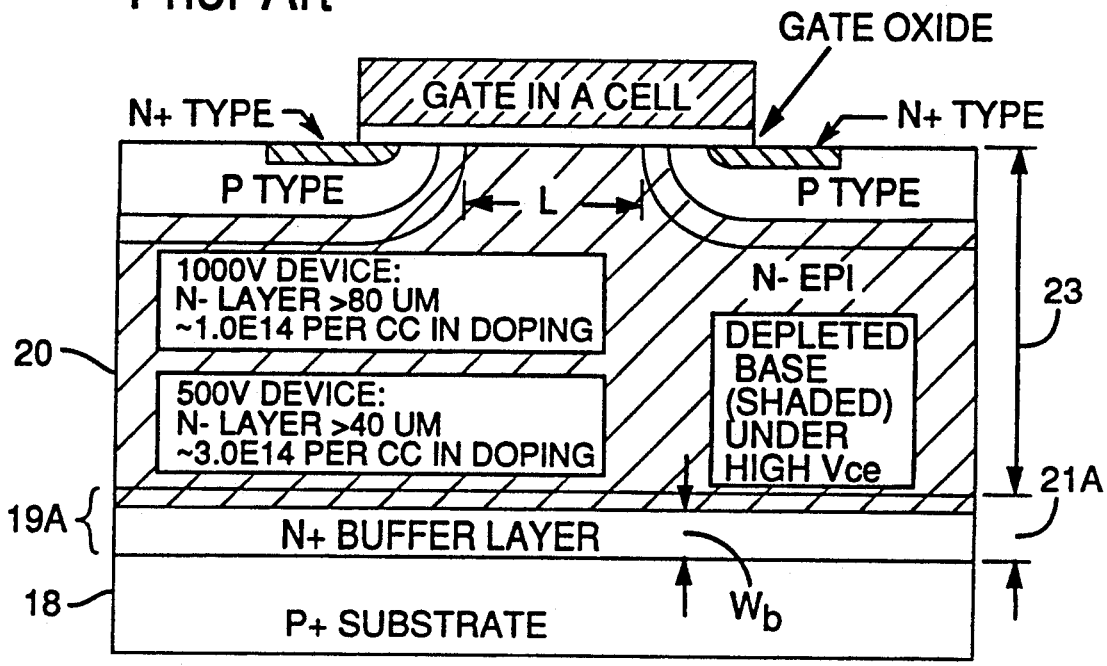
FIG. 24 is a cross-sectional view similar to FIG. 22 showing the prior art N+ buffer layer under high $V_{ce}$ conditions.

As mentioned above, one important characteristics of these devices is their behavior under high $V_{ce}$ conditions. FIG. 24 shows an IGBT-type device in which the layer 18, 19, 20 are sized and doped in conventional manner. In the prior art, N+ buffer layer 19A is typically doped in the range of 1 to $3 \times 10^{17}$ atoms/cm$^3$ and has a thickness 21A of 4 to nearly 15 micrometers, typically under 10 micrometers. The output impedance is given by the equation:

$$R_o = qV_a / (kTg_m)$$

where $V_a = -W_b \times (dV_{ce}/dW_b)$ is the Early voltage $W_b$ is the base width 21 and $V_{ce}$ is the collector-to-emitter voltage.

Under high $V_{ce}$, the lightly-doped N− region 20 is completely depleted and the depletion region extends only slightly into the highly-doped buffer layer, so the base width $W_b$ is controlled by the N+ buffer layer. The prior art device of FIG. 24 exhibits a relatively low gain and low output impedance.

Figure 25:
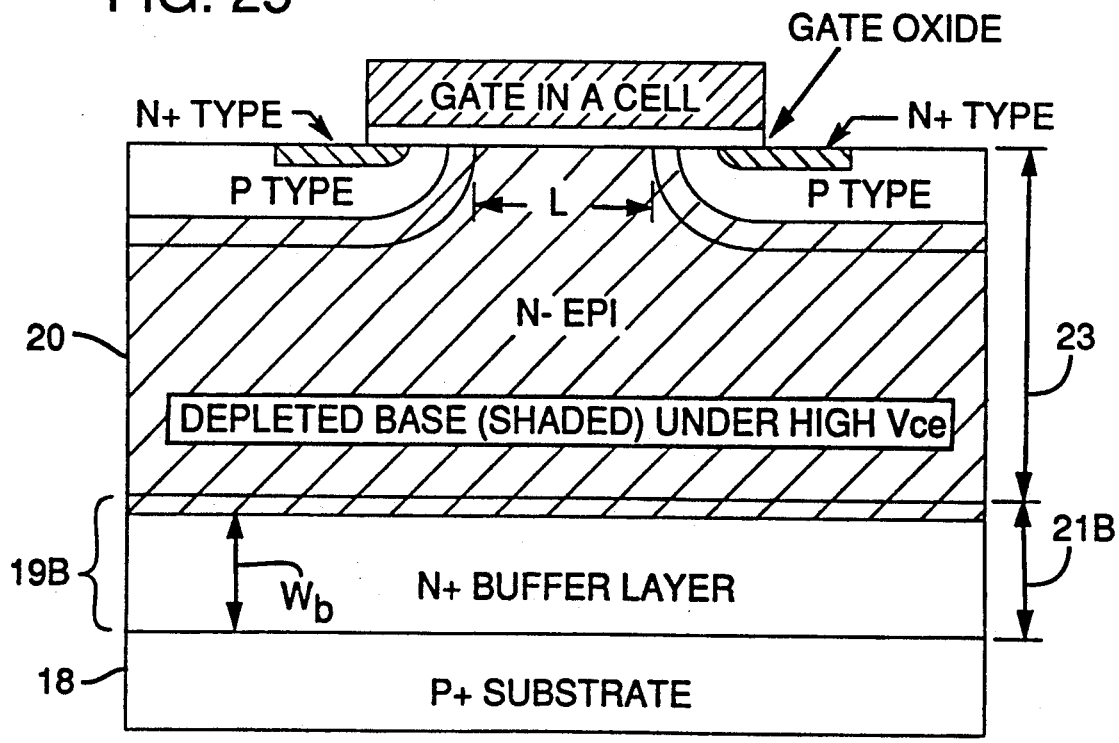
FIGS. 25 and 26 show the effects of changing independently the thickness and doping, respectively, of the N+ region as contemplated by the invention.
Figure 26:
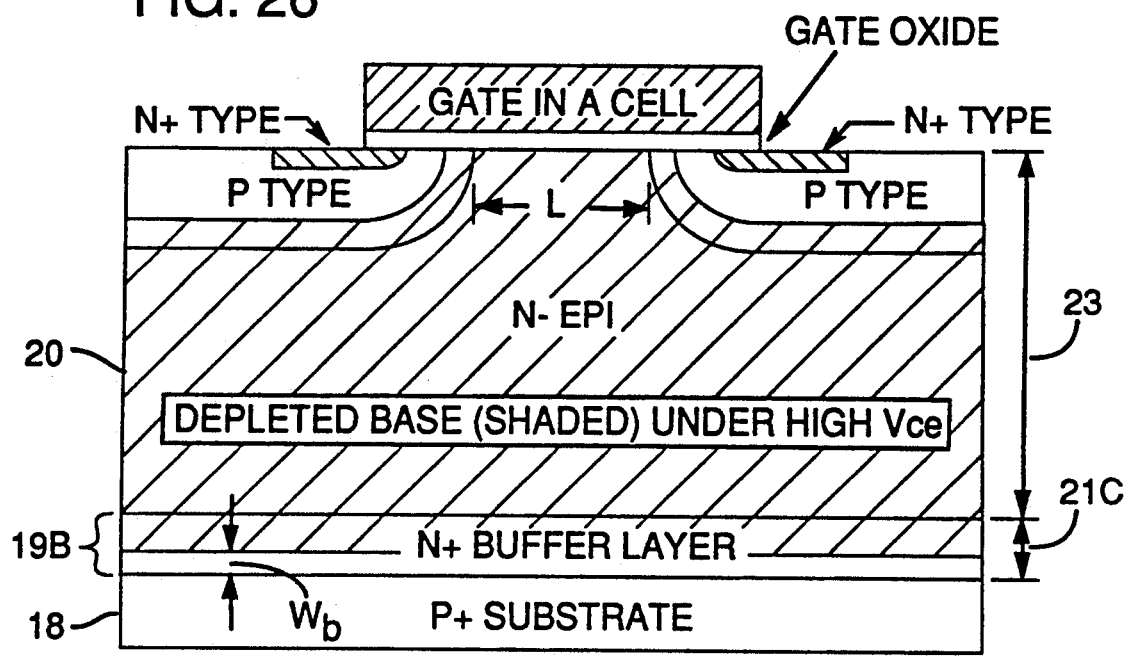
Figure 27:
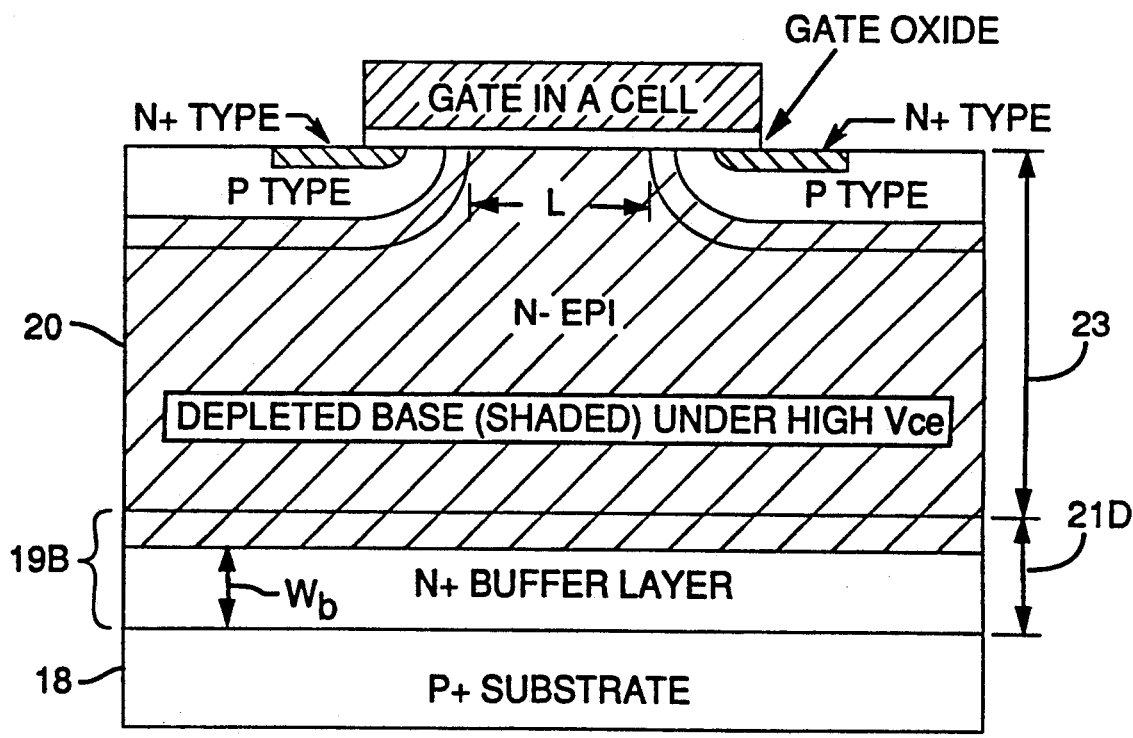
FIG. 27 shows the effects of changing both the thickness and doping of the N+ region in accordance with the invention.

Preferably, applicant's devices have greater thickness and lower doping concentration in the N+ region than are used in the prior art, yielding improved device characteristics as next described with reference to FIGS. 25, 26 and 27. FIG. 25 shows the first aspect of these improvements, wherein the N+ layer 19B has a thickness 21B of greater than 15 micrometers with doping of over $1 \times 10^{17}$ atoms/cm$^3$. Doing this alone increases $W_b$ (the base width 21), thereby increasing output resistance, and slightly increases forward conduction losses. FIG. 26 shows the effect of decreasing doping concentration to less than $5 \times 10^{16}$ atoms/cm$^3$ while keeping the thickness 21C of N+ layer 19B at less than 10 micrometers. This gives the device higher gain but not higher output impedance. FIG. 27 shows the effect of combining the measures of FIGS. 25 and 26. Such devices are suitably made with an N+ doping in layer 19C of less than $1 \times 10^{17}$ atoms/cm$^3$, preferably in the range of $5 \times 10^{15}$ atoms/cm$^3$ to $1 \times 10^{17}$ atoms/cm$^3$, and a thickness 21D of greater than 15 micrometers, preferably in the range of 20–50 micrometers so that the total donor concentration in the N+ layer remains at the level of $>1.0 \times 10^{14}$ cm$^{-2}$ for low pnp bipolar gain. It is believed that the best devices will be produced with an N+ doping of about 5 to $9.0 \times 10^{16}$ atoms/cm$^3$ (0.1 ohm-cm) and a thickness 21D of about 30 micrometers to achieve a balanced performance between forward voltage, speed and short circuit withstand capabilities.

Yet another way of improving the device short circuit withstand capability is to use a tri-layer epitaxial material of which the N+ region 19 comprises two layers or subportions of different doping concentrations and an N− layer 20 as discussed above. The first subportion of the N+ layer is deposited as thinly as possible next to the P+ substrate and should have relatively high doping concentration, greater than $10^{17}$ atoms/cm$^3$, to control emitter injection efficiency and gain of the pnp transistor. This layer preferably has a thickness of 5 micrometers or less but can be in the range of about 5 to 10 micrometers thick. On top of this layer, a thicker (20–50 micrometer) N+ layer of lower doping concentration ($1 \times 10^{15} - 5 \times 10^{16}$ atoms/cm$^3$) is added to provide the base width necessary for ruggedness. Then, N− layer 20 is added as discussed above. This approach increases the complexity of the starting material construction but affords a higher level of flexibility in forward voltage and speed control.

It should be clear from the above discussion that several ways can be used within the scope of the invention to increase device output impedence $P_o$ by adjusting the pnp transistor base width without compromising device speed and forward voltage. Laska's case with no N+ layer is the extreme condition of base width at the cost of too great an increase on forward voltage. Our proposal alleviates the problem.

Oxide layer 26 can vary in a range of 1000–2500Å but for use in an IGBT has typical thickness of about 1000Å and a thickness of about 1625Å for making a MOSFET. The oxide layer can be formed by plasma enhanced chemical vapor deposition (PEVDC) or can be conventionally thermally grown as an initial processing procedure through oxidation in a diffusion furnace at a temperature of around 1000° C.–1100° C. Alternatively and preferably, a thin (100Å) thermal oxide layer is formed to tie down dangling Si bonds at the silicon substrate surface, followed by a plasma enhanced chemical vapor deposited (PEVDC) layer to form oxide layer 26. The resulting layer 26 forms the gate oxide layer in the final gate structure 12.

Prior to forming the oxide layer, a preliminary doping step is performed in the areas that will ultimately underlie and marginally surround the gate pads, main bus and secondary buses as shown in FIGS. 18-23. This step is performed by conventional masking and patterning techniques, which need not be further described. The patterning used in this step is designed to form doped regions in substrate regions on the device that are prone to lower breakdown voltage under gate bonding pads and low signal-delay buses. This is an extension of the method that is the subject of applicant's co-pending U.S. patent application Ser. No. 07/663,297, SEMICONDUCTOR DEVICE WITH DOPED ELECTRICAL BREAKDOWN CONTROL REGION (continuation of Ser. No. 06/842,464 filed Mar. 21, 1986), incorporated by reference herein. The pattern for the presently preferred doping is next described with reference to the preferred die layout shown in FIGS. 18 and 19.

Figure 9:
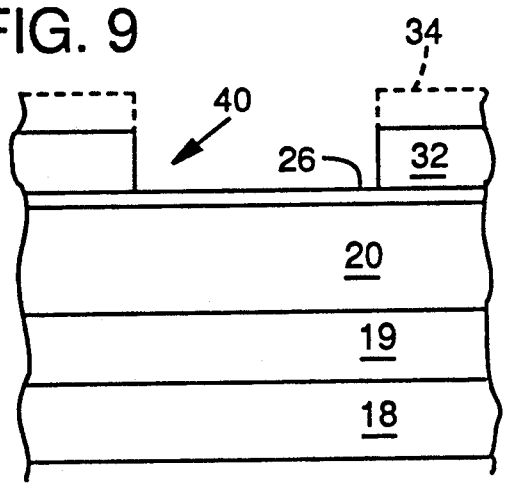
Figure 18:
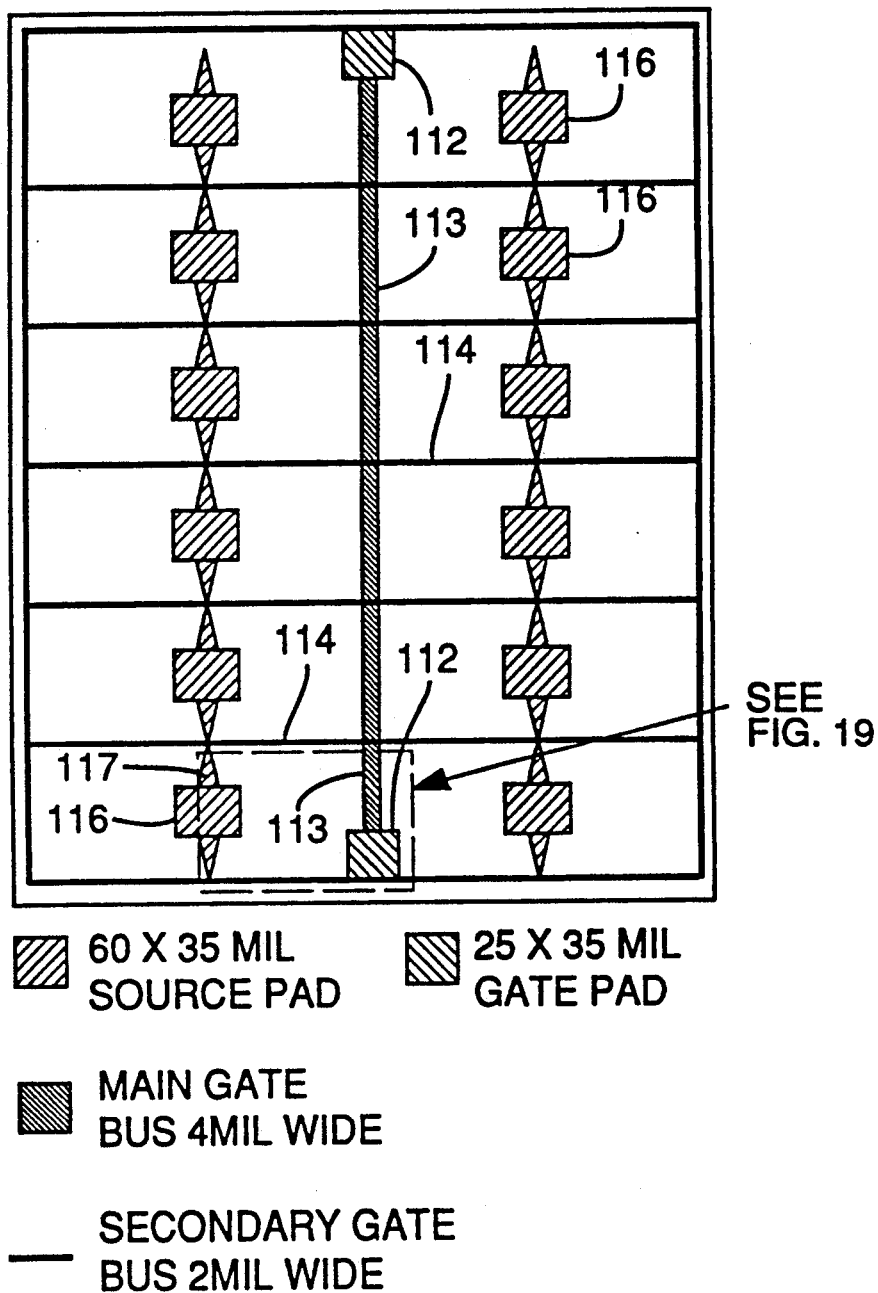

Referring to FIG. 18, a preferred interdigitated finger structure on a rectangular die includes two gate pads 112 at opposite ends of the die, a main gate bus 113 extending lengthwise (vertically in the drawing) between the gate pads through the center of the die, secondary (horizontal) gate buses 114 spaced at intervals perpendicular to the main gate bus, and a series of source pads 116 and buses 117 spaces between the main gate bus and the sides of the die between each secondary gate bus. It is obvious that gate pads need not be located as shown. Alternative positions, such as one central located gate pad, are common. After forming the source and gate metal layers 28, 30, a second layer of metal is deposited to form thick gate pads 112 and buses 113, 114 and source pads 116 and buses 117 to bring electrical connections from outside the device and to allow the gate signal to travel throughout a very large area device with minimal delay. These needs demand that the repetitive cell structures be interrupted to permit unusual insertions made into them. Such structures are typically much larger in size than the prevailing dimensions of the cells, as shown in FIG. 9.

The trend in design of active cells has been to continually push the limits of lithography for ever-smaller size. Depending on the lithographic capability of a manufacturer, the cells can be submicrons to tens of microns in size. The bonding pads, on the other hand, are typically hundreds or thousands of microns in linear extent by virtue of the need to interface with the coarse dimension packaging technology. The dimensions of gate signal routing traces are dependent on the dimensions of the device and the speed requirement. Moreover, the inability to control uniform switching of large power within a large device can cause premature device and system failures. To safeguard device reliability, gate routing traces should be much larger than gate cell dimensions, as shown in FIG. 19. For one of applicant's large chip designs, with a long dimension on the order of 738 mils/(18.745 µm), a central gate bus 4 mil (1200 µm) wide with 7 µm of aluminum on top of polysilicon is used parallel to the long side of the chip to achieve a signal delay <50 nS. The sourcepads can be 60×35 mil, the gate pad 25×35 mil, and the secondary gate bus 2 mil wide. Preferably, a double or, better, a triple layer of metal is deposited in the source bonding pad and bus areas 116,117. This measure improves current handling capability, links the source metal areas together in isolation from the gate pads and buses for redundancy protection in case of bonding wire failure and, together with thick (>8 µm) overpassivation, provides mechanical support in a compression bonded package to protect active device areas from damage due to pressure contacts. A thickness of the second layer sufficient to withstand pressure contact in a compression-bonded package is at least 8 micrometers. A second layer of metal is similarly deposited in the gate pad regions of the gate contact layer in isolation from the source pads over a passivation layer.

Because the gate pad and bus structures 112, 113, 114 are drastically different from the cells, the distances between diffusions introduced at the time of producing channel regions around these structures are also different. In VLSI designs, drain-source punch-through limited breakdown voltage decreases as the drain-source dimensions shrink. on the one extreme Conversely, in power MOS devices, junction curvature limited breakdown voltage associated with the body-drain diode decreases as the gate width increases. The reason for this is that, in vertical power DMOS devices, the drain (npn collector) is on the backside of the silicon substrate while source (npn emitter) and body (npn base) diffusions are distributed on the entire front-side. These front-side diffusions are self-aligned to the polysilicon gate periphery. The wider the gate, the farther apart are these front-side diffusions. As reverse bias is applied in normal operation across the drain body diode, the electric field increases at the metallurgical junction and decreases to zero in the neutral regions of the diode. When diffusions are close together, the electric field of abutting diffusions add vectorially to cancel a portion of the field strength. When the diffusions are infinitely apart, no field cancellation exists and each diffusion behaves independently of one another. From various gate routing traces to the gate pads, the effect of field cancellation diminishes by virtue of the distances between the body diffusions around the periphery of these structures. Since application Ser. No. 07/663,297 has been filed, applicants have learned how to further improve upon that concept.

Widening the gate routing buses causes substantial loss of channel region which is the price to pay to preserve switching integrity. Along the periphery of the gate routing buses, however, a few percent of the channel width can be saved if the doping underneath them can be moved back from both edges of the polysilicon gate periphery so as not to overlap into the active cells. The structures in this new approach show DMOS body and source diffusions at both edges of the gate in a cross-sectional view through a gate bus 114 (Compare FIGS. 20 and 21 to FIG. 22) . In the middle of the substrate region underlying the gate bus, equidistant to the DMOS diffusions, is the pad/routing bus diffusion 120. The distance L between the pad/routing bus diffusion and the DMOS diffusions 22 in FIG. 21 is equal to or less than the distance between complementary DMOS diffusions on opposite edges of a normal gate cell in FIG. 22. The junction depth and radius of curvature of both diffusions should be matched as proposed in the application Ser. No. 07/663,297. By so doing, the spacing requirement to keep the blocking capability above that of a normal cell is fulfilled while sizable channels, preserve. All gate buses not of the standard cell dimension can be so doped to preserve blocking capability.

This modified pad doping, if left isolated from the body, may float to potentials high enough to rupture the gate oxide. Therefore, the pad/routing bus diffusions must be electrically connected to the DMOS body. This is accomplished by placing at discrete locations shorting bars 122 at the time the pad/routing bus doping is introduced traversing the direction of the gate into the active DMOS cells. The frequency of this shorting bar arrangement depends on the resistance of the pad/routing bus diffusions. A rule of thumb that has worked satisfactorily is that the maximum voltage drop due to current flow in the segment of diffusion underneath the gate bus between shorts should be less than one diode forward turn-on voltage, i.e., ~0.5 V under hot inductive switching conditions.

FIG. 19 shows a portion of the die of FIG. 18 without metallization, revealing underlying gate polysilicon layer 32 in the gate pad and bus areas 112A, 113A, 114A and in the gate finger areas 116A. The gate fingers are spaced apart and the intervening regions form source fingers 118 which connect at their proximal ends to the source pad and bus regions 117A. The gate and source fingers are thereby interdigitated and, additionally, are tapered in a complementary fashion. The width of the source fingers 118 thus increase from their distal ends 118A (adjoining the gate pads and main bus) proceeding toward their proximal ends. The interdigitated gate fingers have a width that is likewise least at their distal ends (adjoining the source pad and bus 117A) and increases proceeding toward their proximal ends connected to the gate bus (i.e., toward the distal ends of the source fingers). The widths of the source fingers are sized to a width at their proximal ends ample for carrying the maximum rated source current of the device with a cumulative voltage drop of no more than a fraction of a volt at rated current over the length of the source fingers. The gate(s) bus is likewise tapered. The tapered shape serves to increase the current-carrying capacity of the source fingers approaching the source bus to minimize current crowding problems while maximizing die area utilization (optimizing repeat distance between cells).

Figure 20:
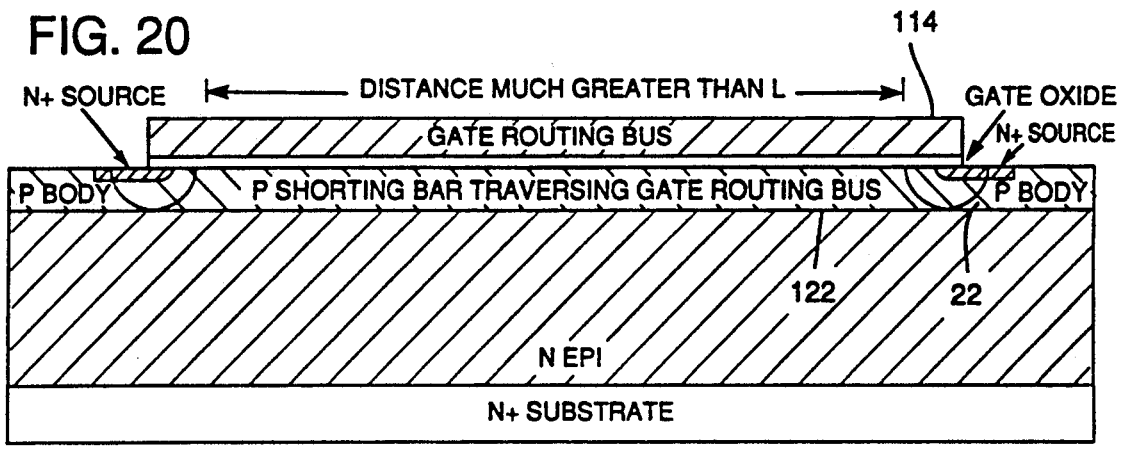
FIGS. 20 and 21 are enlarged cross-sectional views taken along lines 20—20 and 21—21, respectively, in FIG. 19 showing P+ shorting bars spaced at intervals along the secondary gate bus.
Figure 21:
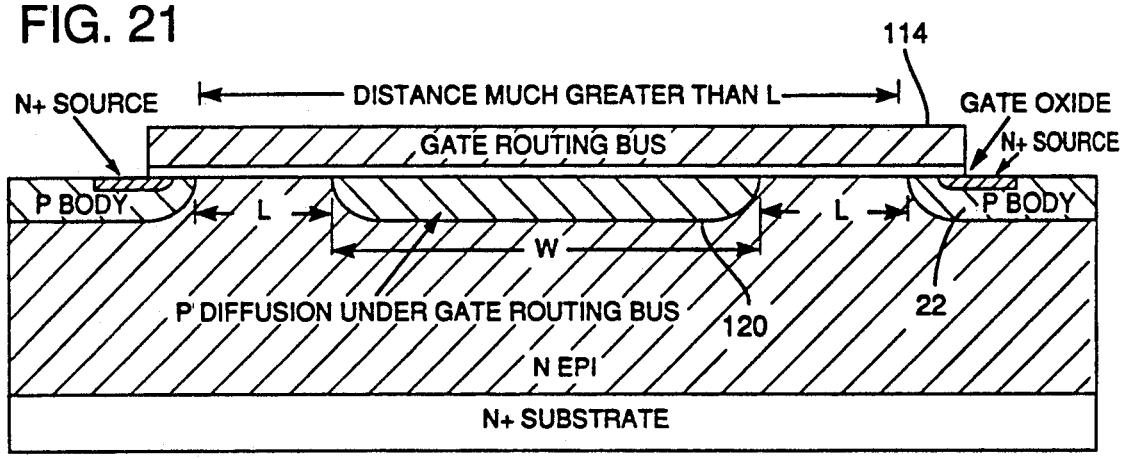

The area underlying the gate pad and main bus areas is heavily doped with a P-type dopant (in N-channel devices), such as boron, so as to interconnect the P-type body regions 22 where they adjoin the gate pads and main bus, in the manner shown in FIG. 20. Additionally, a marginal area surrounding the gate pads and main bus is likewise P-doped outward from the gate polysilicon 112A, 113A to boundaries defined by lines 119. Further, the areas under the secondary (horizontal) gate buses is similarly P-doped in a fishbone-like pattern defined by a longitudinal central stripe 120 spaced between the adjacent channels extending along opposite sides of the gate bus and shorting bars 122 extending across the central stripe spaced to couple the stripe to the body regions at intervals while retaining a substantial proportion of active channel between the shorting bars.

Figure 22:
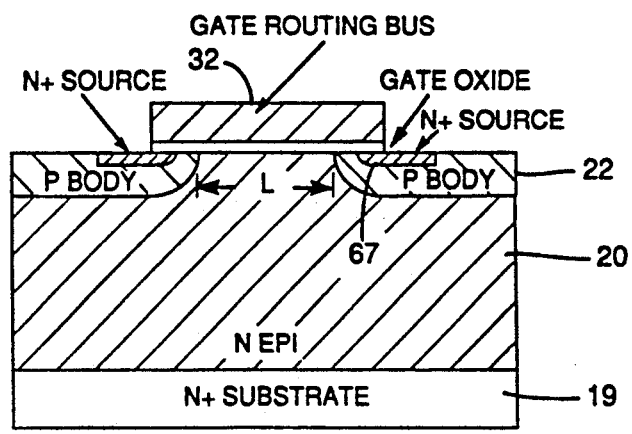
FIG. 22 is a cross-sectional view similar to FIGS. 20 and 21, taken along lines 22—22 in FIG. 19, showing the gate structure within the active cells for comparison.
Figure 23:
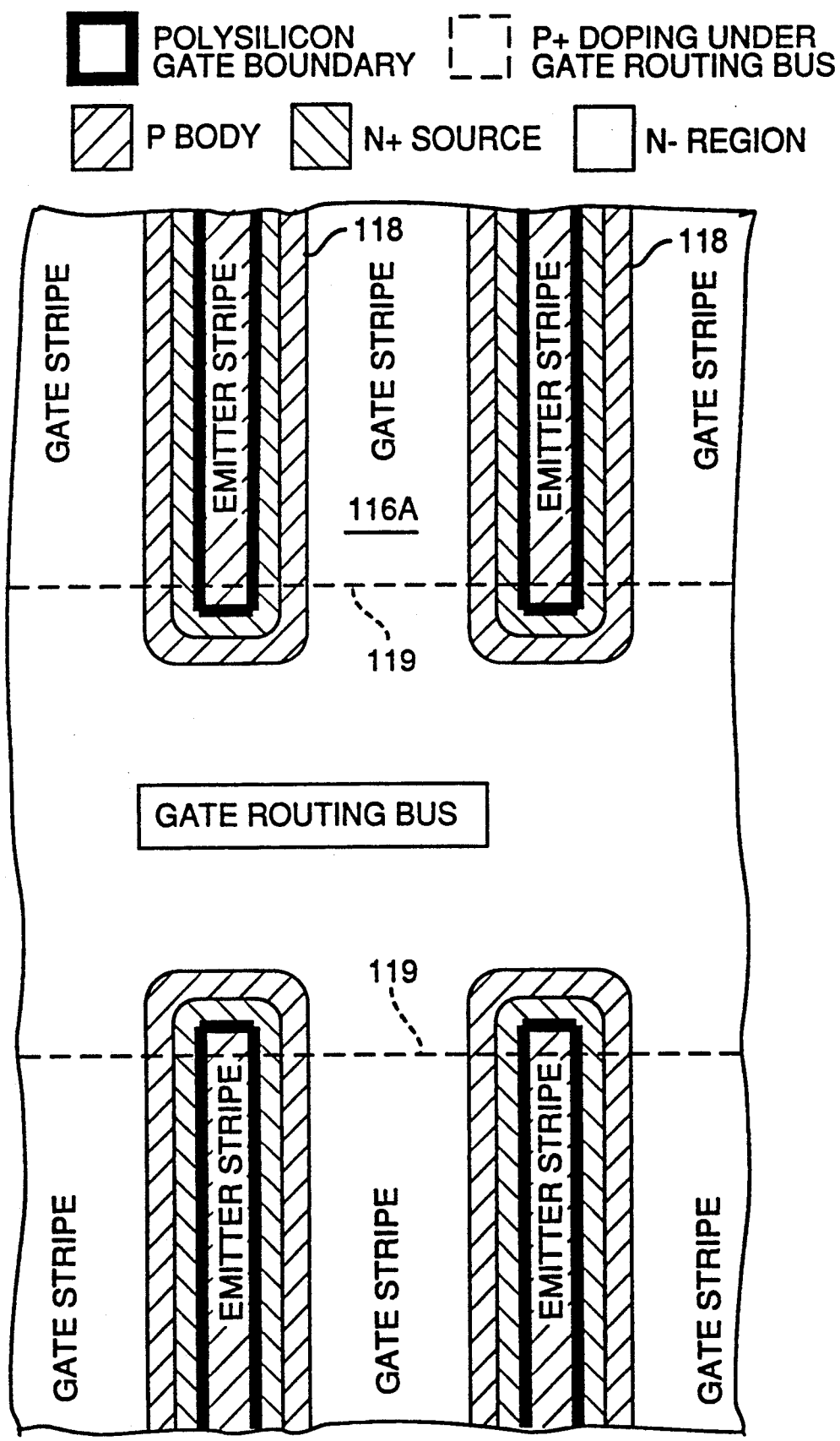
FIG. 23 is a further enlarged plan view of a portion of FIG. 19 showing details of the doping pattern used along the distal ends of the source fingers adjoining the gate bus and pads.

Doping under the gate pads and buses is performed by conventional ion implantation and diffusion, to produce a doping concentration (preferably about $1 \times 10^{15}/cm^3$) equal to or preferably exceeding the concentration of the P-type body region 22 (preferably $2.4 \times 10^{14}/cm^3$) and a depth approximately equal to that of the P-type body region. FIG. 20 shows the shorting bar where it traverses the gate bus. FIG. 21 shows the central stripe 120 at a position between the shorting bars. The stripe is sized to a width W such that the spacing L between the stripe 120 and the adjacent P-body regions is equal to the spacing L between P-body regions under the gate fingers, which is shown in FIG. 22. This arrangement maximizes that length of available active channel along the secondary routing buses. Several percentage of overall active channel width of a high-current device have been saved by this method. The P-doped margins defined by lines 119 along the main gate bus gate neutralize the active channel areas around the distal ends 118A of the source fingers. Such areas form corners which are ordinarily susceptible to localized breakdown or latching conditions but such conditions are avoided by doping margins 119.

Figure 4:
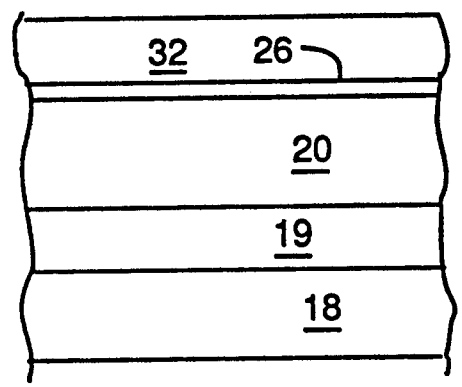

FIG. 4 illustrates the preparation of a new layer 32 which overlies oxide layer 26. Layer 32 herein is a dopant-opaque protective layer, preferably formed of polysilicon by conventional chemical vapor deposition with a thickness in a range of roughly 7000–40,000Å and preferably 20,000Å, so as to be impenetrable (100% nonpenetration) by the implantation of doping substances which are used to form previously mentioned regions 22, 24. Layer 32 is preferably formed as two sublayers of polysilicon with an intervening oxide etch stop layer and the lower layer being conductively-doped, as described in our prior U.S. Pat. Nos. 4,895,810 and 5,019,522. Besides serving as a mask in controlling proper doping to create the desired junctions, this layer protects the gate oxide layer from contamination in later process steps.

Figure 5:
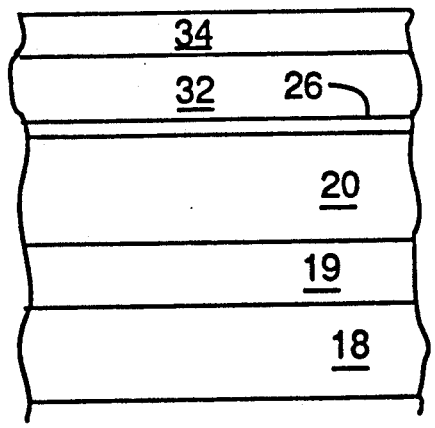
Figure 6:
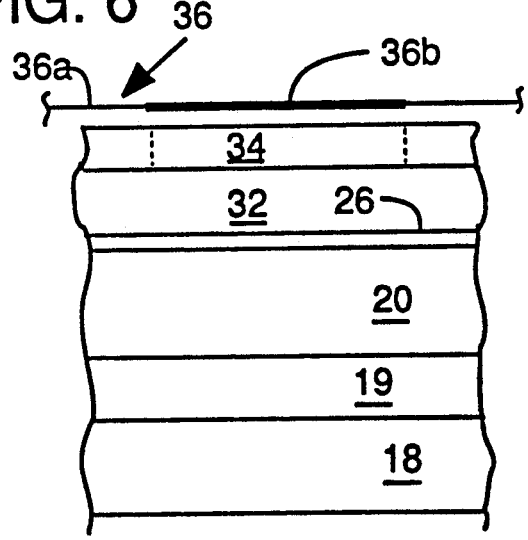

A photoresist layer 34 is next formed over layer 32 by any conventional pinhole-free technique. Negative photoresist is shown in FIGS. 5 and 6; positive photoresist is equally suitable. According to the preferred manner of practicing the invention, only a single masking step, involving a single, independent mask, is required to form the active areas, the source and gate metal layers, and, additionally, the first layer of metal for the buses that connect such layers to gate and source pads (see FIGS. 19-23).

So, turning to FIG. 6, the single, independent mask which is employed herein during the photolithography steps is shown generally at 36. As will be understood by those skilled in the art, the pattern which will ultimately result in transistor 10 is suitably created in mask 36, and in FIG. 6. Mask 36 can be seen to include light-transparent areas, such as area 36a. and light-opaque areas, such as area 36b. This mask is aligned with the previously-doped regions 119, 120, 122. This is a relatively easy alignment given the sizes of the features of the power device. Once this alignment is made all subsequent steps are self-aligned by the following process. The assembly illustrated in FIG. 6 is exposed to light during a typical photolithography step, and as a consequence, the photoresist layer 34 ends up with regions exposed (outside the dashed lines) and regions not exposed (inside the dashed lines) to light.

Figure 7:
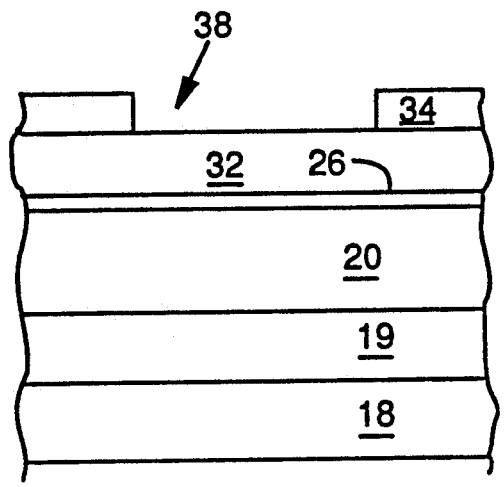

FIG. 7 illustrates the next step, wherein portions of photoresist layer 34, and specifically those regions which have not been exposed to light, are removed conventionally by a suitable photoresist developer. Such a removed or exposed region is shown generally at 38.

Figure 8:
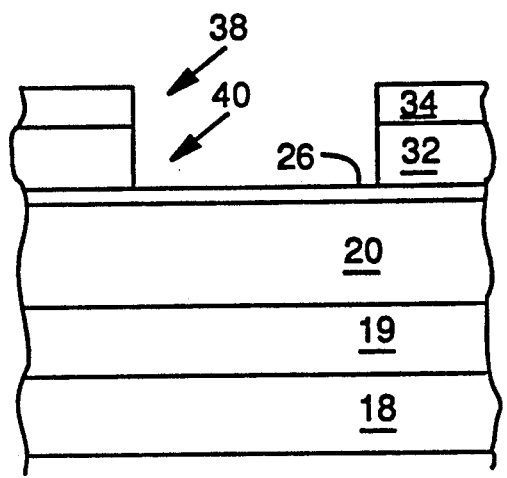

FIG. 8 illustrates the next subsequent step, wherein the polysilicon layer is now etched, by any commercial etching technique, to transfer the image previously created in photoresist layer 34 into layer 32. Accordingly, a matching image for exposed region 38 is created in layer 32, and such is indicated generally as a region at 40. Region 40 is referred to herein as a mask-surrogate pattern-definer. The pattern-definer thus formed has a defined outline characteristic (edge configuration). As will become apparent in the description which continues, this outline per se or with sidewall spacers 62 (see FIGS. 13A-13D) is used as the only necessary self-alignment masking agency in manufacturing steps that follow.

Photoresist layer 34 is next removed by any convenient conventional technique, as illustrated in FIG. 9. The process next proceeds into what are referred to generally herein as doping steps.

Figure 10:
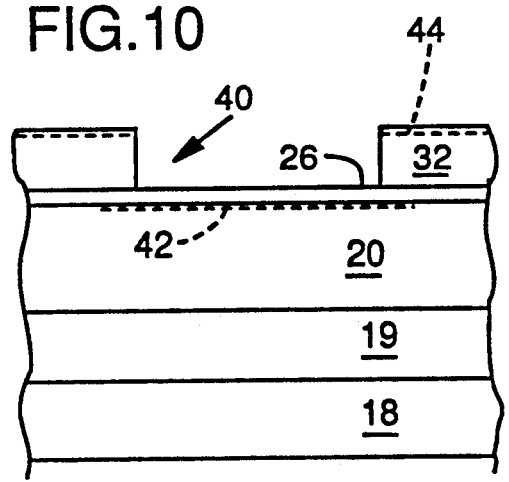

FIG. 10 illustrates a first implant step, which takes the form of a boron implant that will result, as will be explained, in previously-mentioned P-doped region 22. The boron implant step is performed in a conventional implanter at an energy level of about 60–160-KEV to produce an implant density in layer 20 of typically $1.0 \times 10^{14}$ (for MOSFET devices) to $2.0 \times 10^{14}$ (for IGBT devices) atoms/cm$^2$. Dashed line 42 illustrates peak gradient density of dopant implanted into layer 20 by this step, and this implant extends to a depth of about 0.27–0.5 microns. As can be seen, dashed line 42 shows that the implant extends laterally a short distance beyond the boundaries of pattern-definer 40. This results from the action of the gate-oxide layer which functions as a dispersion medium.

A dashed line shown at 44 illustrates that there is similar penetration of boron into polysilicon layer 32, but not a complete penetration of this layer because of its thickness. This effective opacity of layer 32 to boron penetration functions, importantly, to achieve properly controlled doping in this step. While boron has been described herein as the first implant substance, other P-type dopants could be used to perform the same function.

Figure 11:
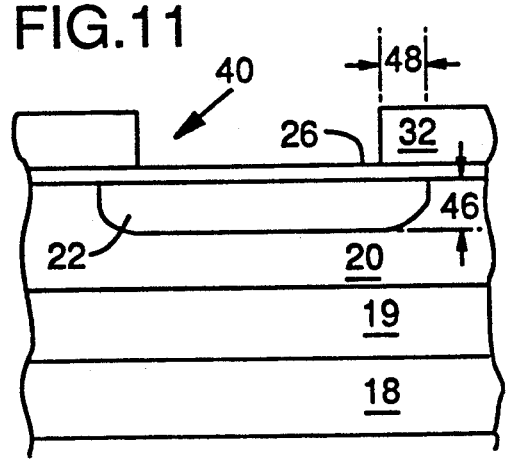

FIG. 11 illustrates a first diffusion step, which is performed in a conventional diffusion furnace at a typical temperature of about 1150° C. for about 3–8 hours. Here, as can be seen, what results is a diffusion of implant 44 to form the beginning of previously described P− region 22. Typically, this diffused region has a depth, shown at 46 in FIG. 11, of about 3–6 microns. This region extends laterally beyond the margins of pattern-definer 40 by a dimension, shown generally at 48, which is about 60–80% of dimension 46.

Figure 12:
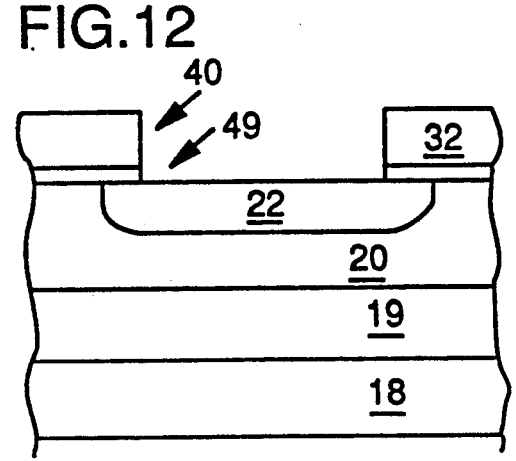

FIG. 12 illustrates the next step in the procedure, wherein gate oxide layer 26 is etched by any suitable commercial etching technique to transfer into layer 26 a matching pattern (image of first pattern-definer 40). Thus, there results an opening 49 in layer 26 which matches (in outline) region 40, which can be referred to as a second mask-surrogate pattern-definer. As discussed below, this step may be omitted under certain conditions.

Figure 13:
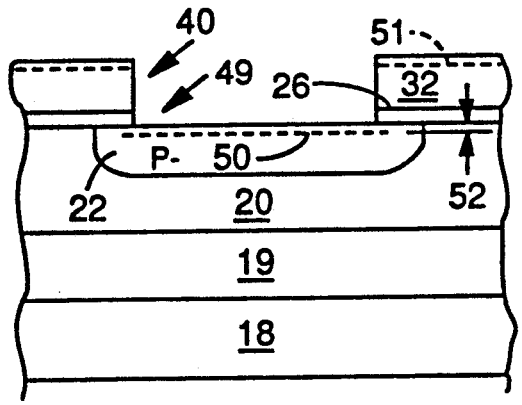

FIG. 13 illustrates a second implant step which is performed herein using an N-type dopant, preferably phosphorus. This step, as was true of the first implant step, takes place in a conventional implanter at an energy level of about 40 to 160-KEV to produce a final implant density of typically $1 \times 10^{15}$ to $1 \times 10^{16}$ atoms/cm$^2$. The peak density of the implant which results in region 20 is indicated by dashed line 50, and this implant extends to a depth, indicated at 52, of about 0.2 microns. It should be noted that, as is indicated by dashed line 50, the implant just performed is contained completely within P-type diffused region 22, and extends laterally slightly beyond the boundaries of pattern-definer 40. The upper dashed line 51 indicates slight penetration of phosphorus into layer 32, nowhere complete penetration. Thus, here too, dopant protection layer 32 functions significantly, as mentioned in connection with the boron doping implant step, to control and effect a proper final doped result.

As one skilled in the art will appreciate, alternative procedures may be concocted to effect the introduction of phosphorus into silicon without the creation of the second mask surrogate pattern definer, such as by increasing the implant energy to penetrate layer 26 without first etching it away. Nonetheless, the first-described procedure involving the forming of opening 49 is preferred. While phosphorus has been used specifically herein to perform this implant, other N-type materials that could be used include arsenic or antimony.

In a later step (See FIG. 14), the phosphorus implant is diffused to form what will ultimately become the N+ type source regions 24. First, however, several steps are performed to topologically define what will ultimately form the source and gate contact structures and isolation thereof. These steps are shown in FIGS. 13A–13D, as next described.

Figure 13A:
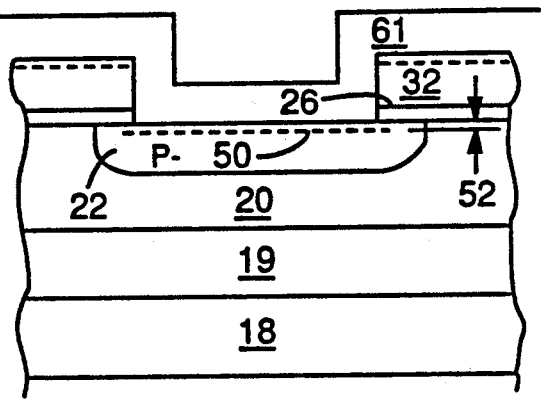

FIG. 13A illustrates layer 61 deposited on top of layers 32, 26 and 22. In the next step, this layer is anisotropically etched to form sidewall spacers 62. Layer 61 can be, but is not restricted to, chemical-vapor-deposited silicon dioxide (preferred), silicon nitride, or oxynitride. This layer may also be thermally grown SiO$_2$, or include an initial thin thermal oxide layer. A wide range of thicknesses can be used for layer 61. For the discussion to follow, a thickness of 1 to 6 micrometers can be used, with the preferred final thickness of 2.0 to 2.5 micrometers.

Figure 13B:
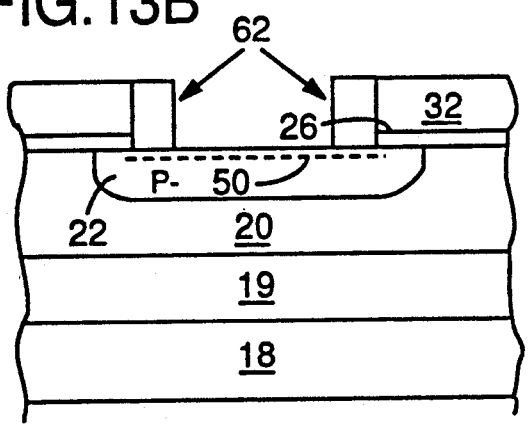

In FIG. 13B, layer 61 has been anisotropically etched by a commercially-available method, such as reactive ion etch, to expose the silicon substrate surface while leaving a substantial amount of layer 61, shown as sidewalls 62, on the vertical sides of layers 32 and 26. Sidewalls 62 will later protect marginal portions of the implant 50 from removal in later steps, and thereby aid in defining the length of the N+ source (emitter) regions 24. Sidewalls 62 will also enhance the isolation of the aforementioned gate 12 and source 16 in later steps and so are referred to alternatively as sidewall spacers 62.

Figure 13C:
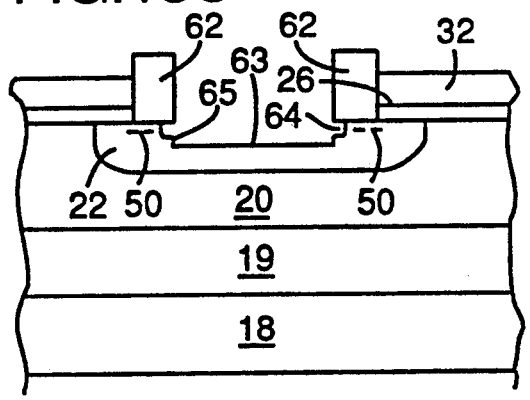

FIG. 13C illustrates that the exposed silicon substrate is etched between areas 62 by a profile controlled method to form a recess or trench 63. The depth of this etch is controlled so that the trench extends down and through implant 50, to an initial depth of about 1.5 micrometers. This is shallower than previously used in applicant's MOSFET process, to allow deeper codiffusion of the P+ implant 66 (See FIG. 13D) under the N+ source to achieve lower base sheet resistance for the parasitic NPN transistor compared to that of the MOSFET device. The preferred stairstep profile of trench 63, with an overhang 64, is shown in FIG. 13C. This overhang enhances the separation of contacts 12 and 16. The profile is preferably produced by the multiple step processing method described in applicant's prior U.S. Pat. No. 4,895,810. This preferred embodiment is achieved by etching on a parallel plate plasma reactor which is bottom powered, such as a TEGAL 701 or LAM 790. A first, isotropic etch of 26–75 sccm (standard cubic centimeters per minute) Sulfur hexafluoride and 20–56 sccm Helium at 0.7–1.1 Torr and 100–250 watts is used to create the overhang 64 with a vertical-to-lateral etching selectivity of less than 3:1. A second, anisotropic step is then performed, adding oxygen at 5.0 to 15.0 sccm, at the same power and pressure to continue the trench deeper and with substantially vertical sides 65 aligned with respect to the spacers 62. This etch is preferably performed with a vertical to lateral etching selectivity of more than 10:1. Layer 32 is reduced in thickness during this operation, however, it is not essential that layer 32 be reduced in thickness.

Figure 13D:
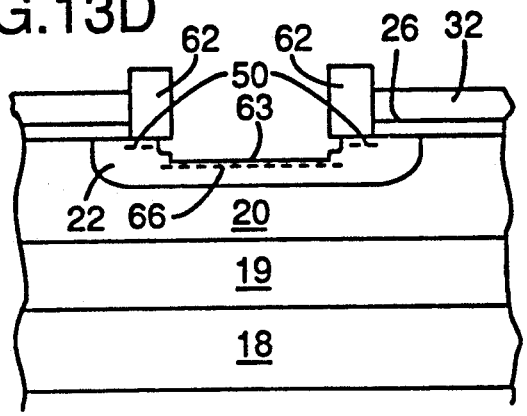

FIG. 13D illustrates a second implant of a P-type dopant to form implanted region 66 at a concentration of $5 \times 10^{14}$ to $2 \times 10^{16}$ ions/cm$^2$ at 30K to 160 KeV to a depth of 0.1 to 0.4 microns in the bottom of trench portion 63. The implant scatters along the margins of region 66 under the trench sidewalls 65. P-type implant 66 diffuses to form P+ region 67 and has the purpose of limiting the depth of diffusion of N-type implant 50 during subsequent diffusion steps, as discussed in the context of FIG. 14, resulting in substantially decreased parasitic bipolar transistor gain.

FIG. 14 illustrates the second and final dopant diffusion step which is conducted to create device 10. This diffusion also takes place in a diffusion furnace, typically at a temperature of 1000° C.–1100° C. for about 1–10 hours, typically about 9 hours. What results, completely within the region indicated at 22, is the completion of the diffusion of implant 50 which will result in previously-described N-type source region 24 and an increased P-type concentration of region 22 shown as area 67. Region 24 has a lateral-extension dimension, shown at 56, (extension beyond the boundaries of pattern-definer 40).

Implant 66 has diffused to form region 67. Region 67 has a depth dimension, shown at 68, of 1–4 microns and a lateral-extension dimension, shown at 69, of about 60–85% of dimension 68. Reference numeral 70 shows the limitation of diffusion depth of N-type region 24 by the interaction of the diffusion of P-type region 67. Codiffusion of implants 50 and 66 results in this interaction, forming a PN junction along line 70. Separate diffusions can be performed or partial diffusion of implant 50 followed by implantation of implant 66 and a final diffusion can also be done.

The dopant selected for implantation and diffusion in these steps may be varied to obtain different relative lateral diffusions of the P+ and N+ regions. Previously, in making MOSFET devices, applicant used boron for the P+ implant together with phosphorus as the N+ dopant. Using a relatively faster diffusing P−type dopant, however, enables the P+ region 67 to diffuse laterally farther under the N+ source region 24 while still keeping the P+ region within the P− diffusion 22. Thus, it is preferred to use aluminum as the P+ region dopant when phosphorus is used as the N+ source region dopant, or to use boron as the P+ dopant with arsenic as the N+ dopant. The P+ implant dose is preferably about 1 to $2.0 \times 10^{16}$ atoms/cm$^2$, about one order of magnitude higher than for MOSFET devices.

Diffused region 67 limits the diffusion depth of implant 50, as it diffuses to form source region 24. It also increases the dopant concentration in region 22, thus increasing the device's capability to withstand substantially greater current during reverse bias conditions than a device without this implant. This increased reverse bias current, commonly encountered during avalanche-energy testing or inductive load switching, is a direct result of the decreased bipolar transistor gain due to use of the presently-disclosed procedure to form the parasitic NPN bipolar transistor formed by N-type region 24, P-type regions 22, 67 and N-type layer 20. This decreased gain is caused by an increased P-type base width between N-type regions 20 and 24 and increased base doping due to diffusion 67. Region 67, protruding laterally nearly to the channel side of the source region (emitter) 22, also works in combination with a very short emitter length to avoid forward biasing the emitter due to hole current flow from the PNP transistor portion of the device sufficiently to turn on the NPN transistor portion of the device. This helps avoid latchup under most operating conditions.

If an oxidizing diffusing cycle is used, then, as a consequence of this second diffusion step, a thin oxide film 51 (shown in dashed line) is grown on the exposed silicon surface of layer 20 within trench 63. At this point in the procedure, this oxide is easily removed by any suitable conventional oxide etching technique. This step is followed by a pre-contact or second anisotropic silicon etching step, not used in the MOSFET process, which increases the trench depth to about 2.5 to 4.5 micrometers.

FIG. 14A illustrates the optional but preferred introduction of phosphorus region 71 to the exposed silicon surface of regions 24 and 67 to enhance subsequent source metal 28 contact to region 24. Introduction of dopant region 71 may be done by a number of conventional methods known to one skilled in the art. This doping step preferably is performed in a diffusion furnace, typically at a temperature of 750° to 1150° C. for 10 to 120 minutes. The source of this phosphorus may be from solid, liquid, or gaseous source or, depending on sidewall profile, may also be implanted. Other dopants such as arsenic or antimony may be substituted for phosphorus. This step is controlled to produce a shallow-diffusion ohmic contact, for example, a concentration of more than $10^{20}$ ions/cm$^3$ and a depth of about 0.5 micrometer. Layer 71 later serves to couple the source metal layer 28 to the source region 24, forming a short between the P+ and N+ regions. Thus, this layer can be referred to as a shorting layer. Alternatively, this shorting layer can formed by depositing a refractory metal or silicide layer as described in applicant's prior U.S. Pat. No. 4,895,810, or by nonselective deposition of metals that do not form a silicide and will not be etched by a subsequent aluminum (gate and source metal) etching step.

FIG. 15 illustrates a subsequent step in which silicon in the upper portion of layer 20 within trench 63 is further etched to produce the deepened, final trench shown generally at 60. The etch just referred to is performed anisotropically using the latter portion of the plasma trench process used in FIG. 13C. It is important that the etch be controlled to assure that the depth of trench 60 extends completely through the N-type diffused contact region 71, but only partially through the diffused P-type region 67. The final trench depth is in the range of 3.0 to 5.0 micrometers, preferably about 4.0 micrometers, which is greater than that used in applicant's prior MOSFET devices, to permit thicker source metal to accommodate higher currents. It is also important that the etching thus performed creates a sufficiently upright wall 65 in trench 60 to positively assure electrical separation, during a later processing step, of the conductive layers 28, 30. Another consequence of the trench etch is the complete removal of the upper portion of polysilicon layer 32, and of the intervening oxide layer, leaving the doped lower portion of layer 32 (see description of FIG. 4 above). These effects lead to the device 10 eventually having a metal-on-polysilicon gate contact 30 separated from the source contact metal 28 both laterally by spacers 62 and vertically by the trench.

Prior to the metallization steps which are next described with reference to FIG. 16 et seq., the substrate is doped with a transition metal, preferably platinum (Pt) but alternatively gold (Au) in similar concentrations to platinum, to effect lifetime control. This is done preferably by ion implantation into either the front or backside of the silicon substrate of a predetermined dose 69 (FIG. 15) of the selected metal. For Pt, this dose is less than $2 \times 10^{16}$ atoms/cm$^2$. Ion implantation permits tight, direct control of dose but other ways can be used to deposit a controlled dose of Pt on the wafer. One suitable alternative is Pt evaporative deposition with in situ Pt silicide formation followed by stripping away the excess Pt in aqua regia, which leaves a thinner layer of Pt than conventional deposition, less than about 20

Angstroms of platinum silicide (about $10^{16}$ atoms/cm$^2$). Since the solid solubility of Pt in silicon is between 4 to 5% at the Pt-Si eutectic temperature, the amount of Pt that can be dissolved into silicon is substantial ($2 \times 10^{21}$ atoms/cm$^3$) which is the cause for the higher leakage current using conventional evaporation and diffusion. Using Pt implantation or the improved platinum-silicide evaporation method, however, the amount can be controlled and limited. A dose in the range of $10^{11}$ to $10^{16}$ atoms/cm$^2$ of Pt is sufficient to effect lifetime control without an appreciable increase in leakage current. Higher doses can be used but will cause a higher leakage current.

After transition metal implantation, the substrate is annealed to diffuse the metal at a predetermined temperature above the eutectic temperature of the transition metal/silicon binary system. For platinum in silicon, the eutectic temperature is 830° C. and the diffusion temperature will be in the range of 830° C. to 1100° C., which is the approximate threshold or annealing temperature at which dopant impurities other than transition metal begin to diffuse appreciably and affect junction depths. Preferably, the diffusion temperature is in a range low enough that the principal diffusions that form the transistor junctions are not appreciably affected. The preferred temperature range is about 870° C. to 900° C. Using implanted dose-related control of the diffusion, which is uniform both center-to-edge across the individual wafers and across the number of wafers in a batch, superior results are achieved.

FIG. 17 shows, in three dimensions, the relationship between amount of metal available at or near the surface of the silicon (vertical axis), annealing temperature, and depth of metal diffusion into the substrate. A diagonal line along the implant dose and temperature plane indicates the solid solubility as a function of temperature. It is clear from this graph why prior art lifetime control by heavy metal evaporation and diffusion must result in high leakage current. For any film of controllable thickness there is simply too much platinum. Besides, any film thickness one possibly can deposit will virtually all be dissolved in silicon.

The range of $1 \times 10^{11}$ to $1 \times 10^{16}$ atoms/cm$^2$ provides effective lifetime control in a wide variety of power switching devices, including MOSFET, IGBT, bipolar, thyristor, diode and rectifier devices, with leakage current equal to or better than that provided by irradiation but without the threshold instability problems of irradiation. Conventional evaporative deposition of e.g. 100Å of platinum will produce an equivalent surface dose of $6.5 \times 10^{16}$ atoms/cm$^2$, diffusion of which would give a leakage current of three to four orders of magnitude greater than no lifetime control. The only control available is temperature and time which provides very poor control of the final Pt profile in silicon. In contrast, implanted platinum doses in the range of $1 \times 10^{13}$ to $1 \times 10^{16}$/cm$^2$ gave leakage currents in power MOSFET and IGBT-type devices that were no more than two orders of magnitude greater compared to devices with no lifetime control. This technique is also less costly than irradiation because conventional implantation machinery can be easily adapted to metal implantation by solid source sublimation. This method thus avoids problems in conventional lifetime control with transition metal that result from depositing excess metal on a surface of the substrate and then allow all metal atoms to be diffused into silicon.

This technique can also be used to profile-tailor the lifetime control dopant with multiple temperature cycles. For PIN or FRED (Fast REcovery Diode), it is desirable to have a diode that does not turn off the current that flows through it too rapidly. Such a diode has a forward recombination time $t_a$ and a reverse recombination time $t_b$. It is desirable for $t_b > t_a$ and for $t_a + t_b$ to be very short, e.g., 40-100 ns. Low lifetime control doping in the bulk of the epitaxial layers combined with a higher concentration near the substrate surface adjacent the PN junction can provide the best effect. This doping profile can be obtained by multiple cycles of the foregoing technique. First, the substrate is lightly dosed with, e.g., $10^{11}$ Pt atoms/cm$^2$, and diffusing the Pt atoms throughout the device at first elevated temperature, e.g., 850°-865° C. for one hour for a PIN. Second, an additional dose of Pt atoms is applied to a selected surface of the device and is diffused at a higher temperature, e.g., 950°-1100° C. for 5-20 seconds (rapid thermal anneal) such that the additional dose is retained in a gradient band near the selected surface. Preferably, the doses can be applied in a single implant or silicide formation step. If gold is used, the second diffusion step can be much longer and done in a standard diffusion furnace.

FIG. 16 illustrates the first step in the metallization, or conductive-material deposition, procedure of the invention. In this step, a conductive material, such as aluminum, is deposited to create source contact layer 28 and gate contact layer 30. This step is preferably conducted by a line-of-sight deposition technique, such as cold evaporation or sputtering, so that the conductive material forms layer 28 in electrical isolation from contact layer 30, but in contact with source region 24 either directly or through source contact region 71. The metal thickness can have a range of 2.5 to 10 micrometers, preferably 3 to 5 micrometers (or more in a deeper trench) for IGBT-type devices. The profile-tailored trench etch, described above with reference to FIG. 13C, in conjunction with line-of-sight deposition of the conductive layers, helps to assure both electrical separation of layers 28, 30 and contact between layer 30 and source region 24. Overhang 64 tends to shield a portion of the exposed silicon trench sidewall immediately under the spacers and thereby enhances separation from conductive layer 30. At the same time, diffusion or shorting layer 71 assures electrical contact between conductive layer 28 and source region 24.

The foregoing step could also be carried out by the deposition of a refractory metal such as tungsten or metal-silicide, by selective vapor deposition or electroplating, with appropriate measures to assure isolation, as next described.

Whatever deposition technique is used will tend to produce a conductive artifact 74 atop sidewalls 62. This artifact can extend downward along the sidewalls, possibly connecting layers 28, 30, and so should be removed. FIGS. 16A-16D illustrate a technique that enhances the isolation of layers 28 and 30 shown in FIG. 16. This technique makes it possible initially to apply continuous conductive films that may initially connect layers 28 and 30 and then separate them electrically.

Figure 16A:
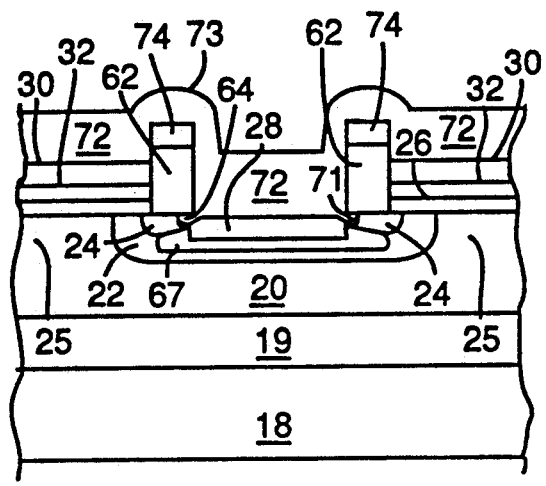

FIG. 16A illustrates the application of a layer 72 on top of areas 30 and 28. This layer may be a resin such as photoresist or any number of other compounds such as polyimide or spin-on glass. Layer 72 is applied so that it tends to planarize the surface such that the region 73 over artifact 72 is substantially thinner than the areas over 28 or 30. This layer may be applied using spin, spray, or roll-on techniques familiar to one skilled in the art to give the preferred coating.

Figure 16B:
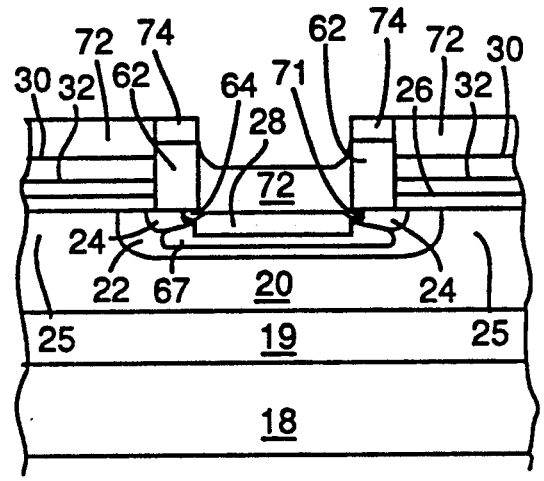

FIG. 16B illustrates the appearance of layer 72 after its thickness has been substantially reduced to expose artifact 74. This reduction can be done by conventional techniques familiar to one skilled in the art, such as plasma etching, ion milling, reactive ion etching, or wet chemical etching. The underlying layers 28 and 30 remain covered and thus unetched. This step is unique due to the fact that pattern delineation of surrogate pattern 40 as modified by spacers 62 is reproduced topographically without conventional methods of lithography or is substantially "self-aligning."

Figure 16C:
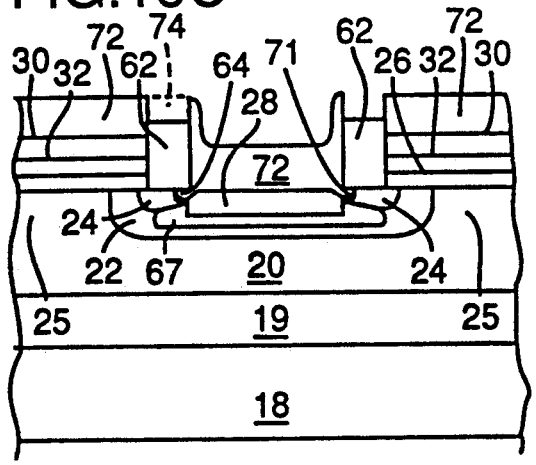

FIG. 16C illustrates the next step, in which artifacts 74 have been etched away. Any metal extending downward along the sidewalls can be removed by continuing the etch. The possibility of a connection between layers 28 and 30 is thus substantially reduced.

Figure 16D:
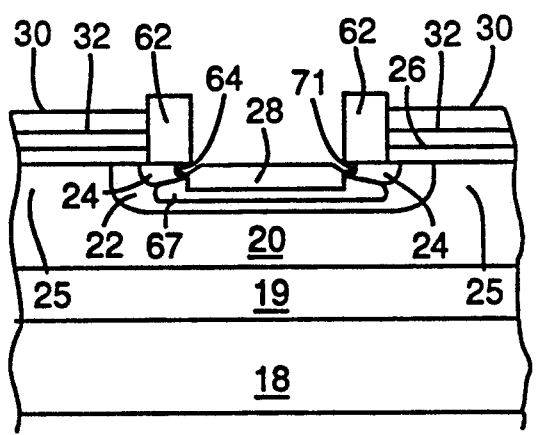

FIG. 16D illustrates the device 10 after layer 72 has been removed. This may be done by any conventional means. If layer 72 is a material that can remain on the device surface, such as glass, removal is not necessary.

Figure 28:
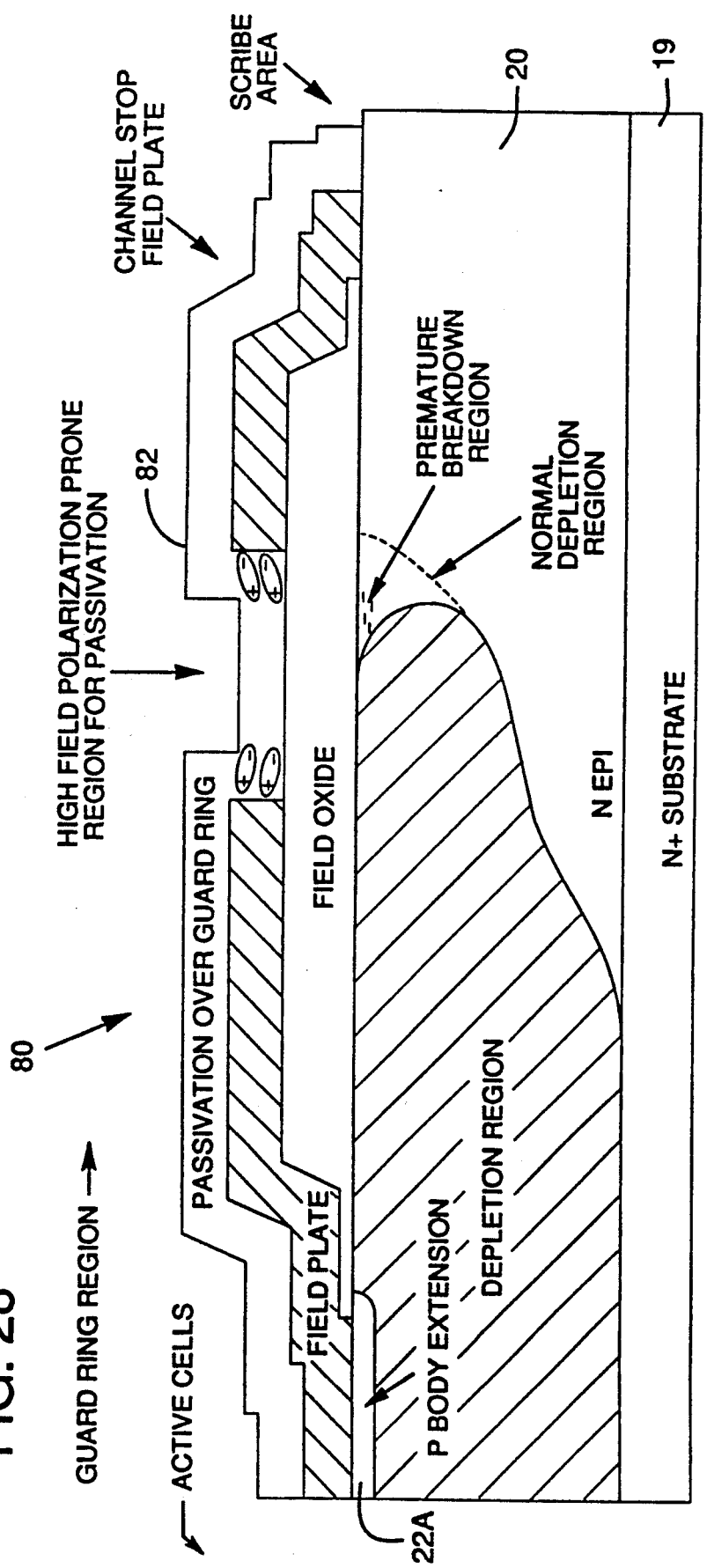
FIG. 28 is a cross-sectional view of a guardring around the periphery of a device showing a polarization prone region which is protected from localized avalanche conditions by a nonpolarizable passivation layer in accordance with the invention. Note that details of the preferred MOSFET cross sectional structure such as recessed source metal, are omitted from FIGS. 20-28; the aspects of the present invention shown therein not being limited to use of that particular structure.

FIG. 28 shows a conventional guardring structure 80 of the type preferably used on applicant's devices. Since this structure and its fabrication are well known, no description is needed. When the device including the guardring is completed, a passivation layer 82 (FIG. 28) is deposited, as is commonly done.

Conventional CV (Capacitance Voltage) testing methods show that LTO and PECVD deposited films are generally polarizable under high voltage conditions. We have further discovered, however, that under certain controlled deposition conditions PSG films show no appreciable polarization for phosphorus content of 3.5% or less under a field as high as 200 V/um at 300° C. Above a doping level of 4%, polarization worsens as the phosphorus content is raised. The ability to provide a barrier to mobile ion movement is, however, not very effective for PSG films with phosphorus content at the 3.5% level. PECVD silicon nitride film deposited under best controlled conditions, on the other hand, is an extremely good mobile ion barrier but at the same time easily polarizable even at field strength as low as 50 V/um at 300° C.

For power MOS devices blocking in excess of 800 V, surface fields in excess of 50 V/um can exist in the guard rings. In the presence of such high electric field, silicon nitride films will polarize with time under temperature, as shown in FIG. 28. Charges associated with polarization of the film eventually will cause change in the silicon-oxide interface leading to degradation of blocking capability of the guard ring design. Charge accumulation can deform depletion regions formed in the substrate decreasing their radius of curvature at their periphery, creating breakdown-prone high field localities. The present invention reduces this problem.

Two approaches have been tested out successfully. One method utilizes a combination of the mobile ion and moisture resistant characteristics of a thinner silicon nitride of 2KÅ to 8KÅ in thickness as a top layer cap in conjunction with a thicker first nonpolarizable film such as a PSG film 10KÅ to 35KÅ thick with phosphorus content below the threshold of onset of polarization (<4%). By using the thick nonpolarizable first layer, the polarizable film is physically farther removed from the silicon-oxide interface leading to reduced effect of polarization in the underlying substrate. By using the thin top layer, the net charge creation due to polarization is also reduced while retaining the mobile ion and moisture resistance. The advantage of this approach is that existing dielectric films can be used and no new films need to be developed.

A second preferred method is to create a new film that is nonpolarizable and mobile ion resistant at the same time. Our study showed that a continuum of oxynitride films ranging in index of refraction from 1.48 to 1.90 from tensile to compressive can be made to be nonpolarizable using PECVD deposition apparatus that is commercially available from several vendors. The deposition conditions and gas dynamics must be appropriately designed, however, to achieve the desired nonpolarization effect. A variety of choices can be available depending on the device surface topography and the need to balance out the issues of stress, effectiveness as a mobile ion barrier, and etching characteristics. The higher the index of refraction and stress, the more nitride-like and consequently more mobile ion resistant is the film. The lowest stress is achieved in the index of refraction range between 1.68 to 1.72.

The polarization property of PECVD films is affected strongly by the deposition conditions. Ionized gas residence time directly influences film polarizability. Longer residence time corresponds to more polarizable films when all other conditions of deposition such as pressure, power, and temperature are equal. Short residence time produces less polarizable films. The trade-off is between polarizability and cost as shorter residence time implies higher velocity gas flow and less efficient utilization of the gases. Each type of deposition system has its own controls for optimization. For a system with long parallel electrodes with gases flowing down the length of the furnace tube, pulsed type deposition is recommended, with short on-cycles interspersed between long off-cycles to allow ionized gases sufficient time to exit the system before the next deposition on cycle. For a system which has very short interaction distance from gas inlets to outlets, residence time is primarily controlled by gas flow and chamber pressure. High gas flow with low chamber pressure corresponds to short residence time. With controlled deposition, nonpolarizable PSG and oxynitride films have been applied to high voltage power devices successfully.

To prevent PECVD deposited films from exhibiting polarization under high field, the film deposition must be controlled. Two types of systems are normally encountered in industry distinguished by the modes of operation of the RF power, CW and pulsed deposition. CW uses continuous deposition with single or multiple frequency RF source. Pulsed deposition allows for chopping of the RF power with discrete on/off cycles. In each system, the residence time of ionized gas molecules in close proximity to the wafer before exiting the deposition chamber and the gas mixture are important in controlling the degree of polarizability.

In addition to mechanical stress, optical properties, index of refraction, and resistance to diffusion, the constitution of a PECVD film will also strongly influence its polarizability. Nitride films are polarizable in general because of the ability for the film to block outward diffusion and entrap hydrogen atoms to form Si—H bonds. Oxide or oxynitride films can also be polarizable if excess Si—H are incorporated into the film. Since the deposition of PECVD films involves silane ($SiH_4$) based gases ($SiH_4+NH_3$ for nitride, $SiH_4+N_2O$ for oxide, and $SiH_4+NH_3+N_2O$ for oxynitride), it is not surprising that these films usually contain excessive Si—H and polarize easily unless care is taken. The incorporation of various components in the film, of course, depends on the composition and ionization state of the gas mixture. The longer ionized silane is in close proximity to the wafer surface and the higher the partial pressure, the more likely it will be incorporated into the deposited film.

Given that various constructions exist on systems used to deposit PECVD films, the conditions for minimizing incorporation of Si—H will not be the same. The common denominator of the present invention in all systems, however, is to minimize Si—H incorporation. To repeat, this can be achieved in any system by controlling the partial pressure of silane in the gas mixture and the residence time ionized silane stays in the deposition chamber. The lower partial pressure and shorter residence time are the preferred parameters. There is not a single set of numbers which can be used to achieve the same desired result in different systems because of diversity of systems.

To give an example, let us look at a system employing parallel electrodes in a long diffusion furnace, such as with an ASM system, a familiar brand to those skilled in the art. Choosing a gas mixture of 125 sccm silane ($SiH_4$) to 1800 sccm of ammonia ($NH_3$) in the ratio of 1:14, a chamber pressure of 2.5 torr, a deposition temperature of 430° C., and a deposition cycle of 25 mS on/200 mS off, the deposited film is highly polarizable when thickness exceeds 2000Å. If the cycle is changed to 12 mS on/200 mS off with all other parameters unchanged, however, the silane residence time is nearly halved yielding a substantially less polarizable film. If we maintain the same gas flow for silane and ammonia but inject a very small amount of nitrous oxide ($N_2O$) in the amount of <0.1 in ratio to silane and retain the same deposition condition, the film is not polarizable at all and behaves close to the nitride film without $N_2O$ in terms of mechanical strength. If the on/off cycle is returned to 25 mS on/200 mS off, however, polarizability returns even with the same small amount of $N_2O$. For any given deposition temperature, chamber pressure, and on/off cycle, the polarizability reduces with reduction of silane partial pressure.

Upon further analysis, the role that gas ratio plays on the availability of Si—H and resultant polarizability seems logical. The complex effect played by residence time defined by the on/off cycle in conjunction with the chamber pressure is more difficult to model. What is affected is the microscopic process of growth of the film. The absorption and desorption process of each of the constituent ionized molecules at the wafer surface can be affected strongly by the velocity of the molecules moving in the gas stream as well as by its partial pressure. As speed of ionized molecules increases, their relative ability to scatter, diffuse, attach to the wafer surface, react chemically, desorb, and diffuse back into the gas stream in any given time interval will change for each gas component differently. Our observation is that as a brief period of off-time is introduced after a short deposition period, hydrogen atoms desorb and remove themselves from the surface leaving a film less populated with Si—H molecules. Adding a small amount of oxygen helps to tie down the hydrogen to form Si—OH bonds and also reduces polarizability. But if the amount of Si—H incorporation exceeds the Si—OH formation rate, excessive Si—H bonds can still exist to produce polarization.

For systems that use CW deposition, there is no independent means of introducing an "off" cycle to allow hydrogen to desorb. The only method available for reduction if Si—H is through the gas ratio control. A much lower partial pressure of silane than used in the first case is necessary to achieve comparable results.

As a user of a particular equipment, the parameters for achieving nonpolarizable film can best be established empirically following the above guideline to reduce Si—H incorporation for film deposition and test the resulting films by applying high voltage ($\sim$200 V/um) on metallized dots across such films in conventional CV (capacitance voltage) measurements.

Accordingly, one should now see how the method proposed by the invention offers a dramatic improvement over the best-known prior art procedures for making power MOSFET and IGBT devices. The discussion to this point has centered primarily on IGBT-types devices with comments given for MOSFET devices wherever appropriate. The concepts disclosed on lifetime control, rugged short circuit withstand capability, nonpolarizable passivation for high voltage reliability, and layout improvements to minimize localized weak spots and latching, apply equally to another class of power devices akin to MOSFET's and IGBT's, including the MOS-controlled thyristor (MCT), as described, for example, by V.A.K. Temple, in IEEE Trans. Electron Devices, ED-33, No. 10, pp. 1609-1618, Oct. 1986, and its derivative, the emitter switched thyristor (EST) described by J. Baliga in IEEE Trans Electron Devices, ED-38, No. 6, pp. 1619-1623, July 1991. These devices are designed to operate in the thyristor mode during on-state and are switched off like IGBTs in transition from on- to off-state. The sequence described above for making IGBTs can easily be adapted to making MCTs and ESTs by those skilled in the art by adding two additional diffusions to the current IGBT process to realize the thyristor. These teachings can also be used to advantage in the making of other power devices such as bipolar transistors, BJTs, PN diodes and P-i-N rectifiers. Various aspects of the invention, can also be used in device structures and processes other than applicant's preferred recessed-source device and process with interdigitated finger layout, including planar structures and polygonal cell layouts.

Having described and illustrated the principles of our invention in a preferred embodiment and variations thereof, it should be apparent to those skilled in the art that the invention may be modified in arrangement and detail without departing from such principles. We claim all modifications coming within the scope and spirit of the following claims.

We claim:

1. In a fabrication process for making a semiconductor power device having at least one PN junction, an improved minority carrier lifetime control process comprising:

selecting a transition metal having a deep level in silicon suitable for recombination;

determining a maximum dose of the selected transition metal that can be fully dissolved into the substrate at a temperature in a range between a eutectic temperature of the substrate and an annealing temperature of the substrate;

determining and depositing a dose of the transition metal not exceeding the maximum dose sufficient to effect lifetime control without substantially increasing leakage current of the device; and diffusing the metal atoms throughout the substrate at a temperature within said range, including:
diffusing a first portion of the dose throughout the substrate; and
diffusing a second portion of the dose in a gradient band near a selected surface of the substrate.

2. In a fabrication process for making a semiconductor power device on a substrate having at least one PN junction, an improved minority carrier lifetime control process comprising:
selecting a transition metal having a deep level in silicon suitable for recombination;
determining a maximum dose of the selected transition metal that can be fully dissolved into the substrate at a temperature in a range between a eutectic temperature of the substrate and an annealing temperature of the substrate;
determining and depositing on a surface of the substrate adjacent the PN junction, a dose of the transition metal not exceeding the maximum dose sufficient to effect lifetime control without substantially increasing leakage current of the device; and
diffusing the metal atoms throughout the substrate at a temperature within said range, including profile tailoring the concentration of transition metal atoms in the substrate relative to the surface of the substrate.

3. The fabrication process of claim 2 wherein the selected transition metal is diffused through the substrate using a rapid thermal anneal process.

4. The fabrication process of claim 3 wherein the amount of time required to perform the rapid thermal anneal process ranges from five seconds to 20 seconds.

5. The fabrication process of claim 3 wherein the amount of time required to perform the rapid thermal anneal process is less than one minute.

6. The fabrication process of claim 2 wherein the elected transition metal is either platinum or gold.

7. The fabrication process of claim 2 wherein the transition metal is tailored to have a relatively shallow profile compared to a completed diffusion throughout the entire substrate.

8. The fabrication process of claim 2 wherein the dose of selected transition metal is in the range of $1 \times 10^{11}$ to $1 \times 10^{16}$ atoms/cm$^2$.

* * * * *

UNITED STATES PATENT AND TRADEMARK OFFICE
CERTIFICATE OF CORRECTION

PATENT NO. : 5,283,202
DATED : February 1, 1994
INVENTOR(S) : Douglas A. Pike, Jr., et al.

It is certified that error appears in the above-indentified patent and that said Letters Patent is hereby corrected as shown below:

On the title page, the inventor's name should read —Dumiton Scrulla" to —Dumitru Sdrulla—.

Column 4, line 15, insert the following after "characteristics":

—U.S. Patent No. 3,953,243 issued to Goetzberger et al. teaches ion implantation and diffusion of gold or platinum into a semiconductor substrate with pn junctions until change carrier lifetime is approximately stationary.—

Column 14, line 31, change "$P_o$" to —$R_o$—

Column 15, line 24, change "FIG. 9" to —FIG. 19—

Column 30, line 16 change "elected" to read —selected—.

Signed and Sealed this

Fifth Day of September, 1995

Attest:

BRUCE LEHMAN

*Attesting Officer*     *Commissioner of Patents and Trademarks*